United States Patent [19]

Beaulier et al.

[11] Patent Number: 4,602,285

[45] Date of Patent: Jul. 22, 1986

[54] SYSTEM AND METHOD FOR TRANSFORMING AND FILTERING A VIDEO IMAGE

[75] Inventors: Daniel A. Beaulier, Menlo Park; Theodore A. Marsh, San Francisco, both of Calif.

[73] Assignee: Ampex Corporation, Redwood City, Calif.

[21] Appl. No.: 483,424

[22] Filed: Apr. 8, 1983

[51] Int. Cl.[4] .................... H04N 5/14; G09G 1/06; G06F 7/38
[52] U.S. Cl. ................................ 358/160; 358/22; 358/77; 340/731; 340/728; 364/723; 364/724; 382/44; 382/47
[58] Field of Search ............... 358/160, 287, 22, 77, 358/13, 21 R, 183; 364/723, 724; 340/728, 731; 382/44, 45, 46, 47, 56

[56] References Cited

U.S. PATENT DOCUMENTS

| | | | |
|---|---|---|---|
| 4,136,398 | 1/1979 | Eggarmont | 364/724 |
| 4,240,101 | 12/1980 | Michael et al. | 358/11 |
| 4,302,776 | 11/1981 | Taylor et al. | 358/160 |
| 4,463,372 | 7/1984 | Bennett et al. | 358/22 |
| 4,494,214 | 1/1985 | Bernard et al. | 364/724 |

OTHER PUBLICATIONS

Schafer, Ronald W., and Rabiner, Lawrence R., "A Digital Signal Processing Approach to Interpolation", *Proc. IEEE*, vol. 61, pp. 692–702, Jun. 1973.
Oetken, Geerd, Parks, Thomas W., and Schussler, Hans W., "New Results in the Design of Digital Interpolators", *IEEE Trans. Acoust., Speech, Signal Processing*, V. ASSP-23, pp. 301–309, 6/75.
Pearson, D. E., "Transmission and Display of Pictorial Information", John Wiley & Sons (New York–Toronto, 1975).
Gabriel et al, U.S. patent application Ser. No. 310,907, filed Sep. 28, 1981 for "System for Spatially Transforming Images".

*Primary Examiner*—Tommy P. Chin
*Assistant Examiner*—Michael D. Parker
*Attorney, Agent, or Firm*—Gregory L. Roth; Rodney L. Marett; Bradley A. Perkins

[57] ABSTRACT

A video transformation and filtering system generates for each source image data point a plurality of target image addresses indicating a displacement between a point at which the source image data point maps into the target image and each data point of the target image which is affected by the source image data point. By providing either sequentially or in parallel a separate processing for each target image data point that is affected by a current source image data point values for all of the target image data points can be generated from a single pass of the source image data points. By effectively providing the filtering in the domain of the target image instead of the source image a single filter function with a fixed number of points in the target image domain can be used to attain low pass filtering of the resulting target image irrespective of the degree of size compression of the video image.

35 Claims, 20 Drawing Figures

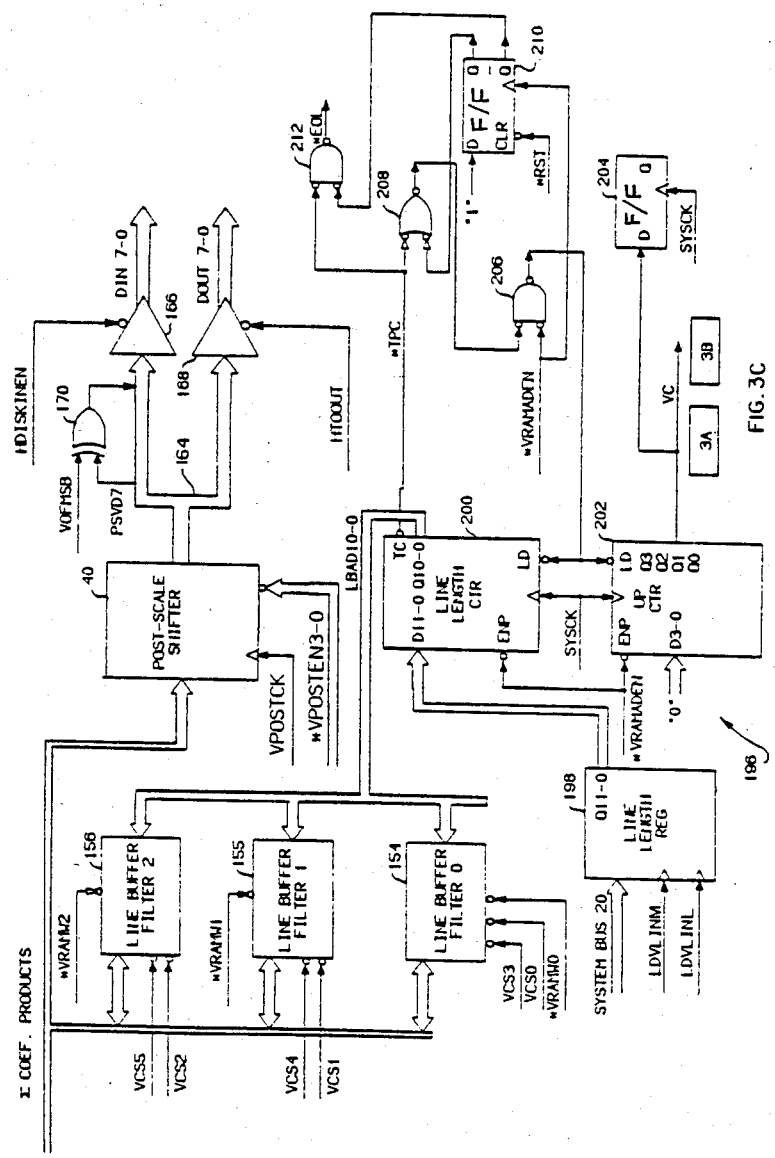

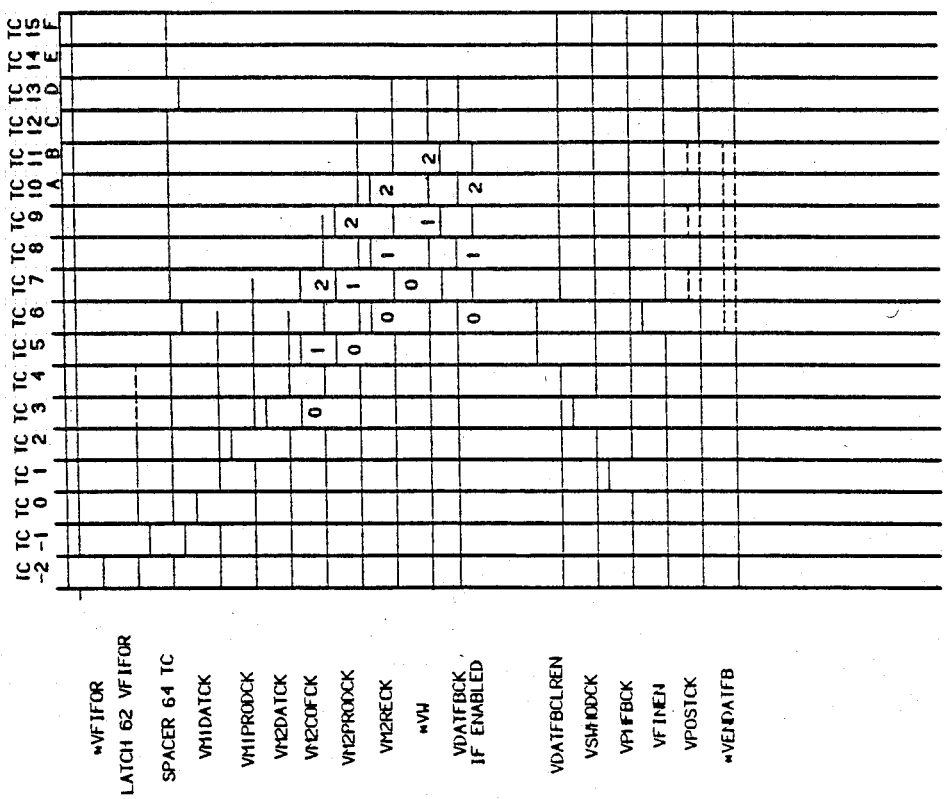

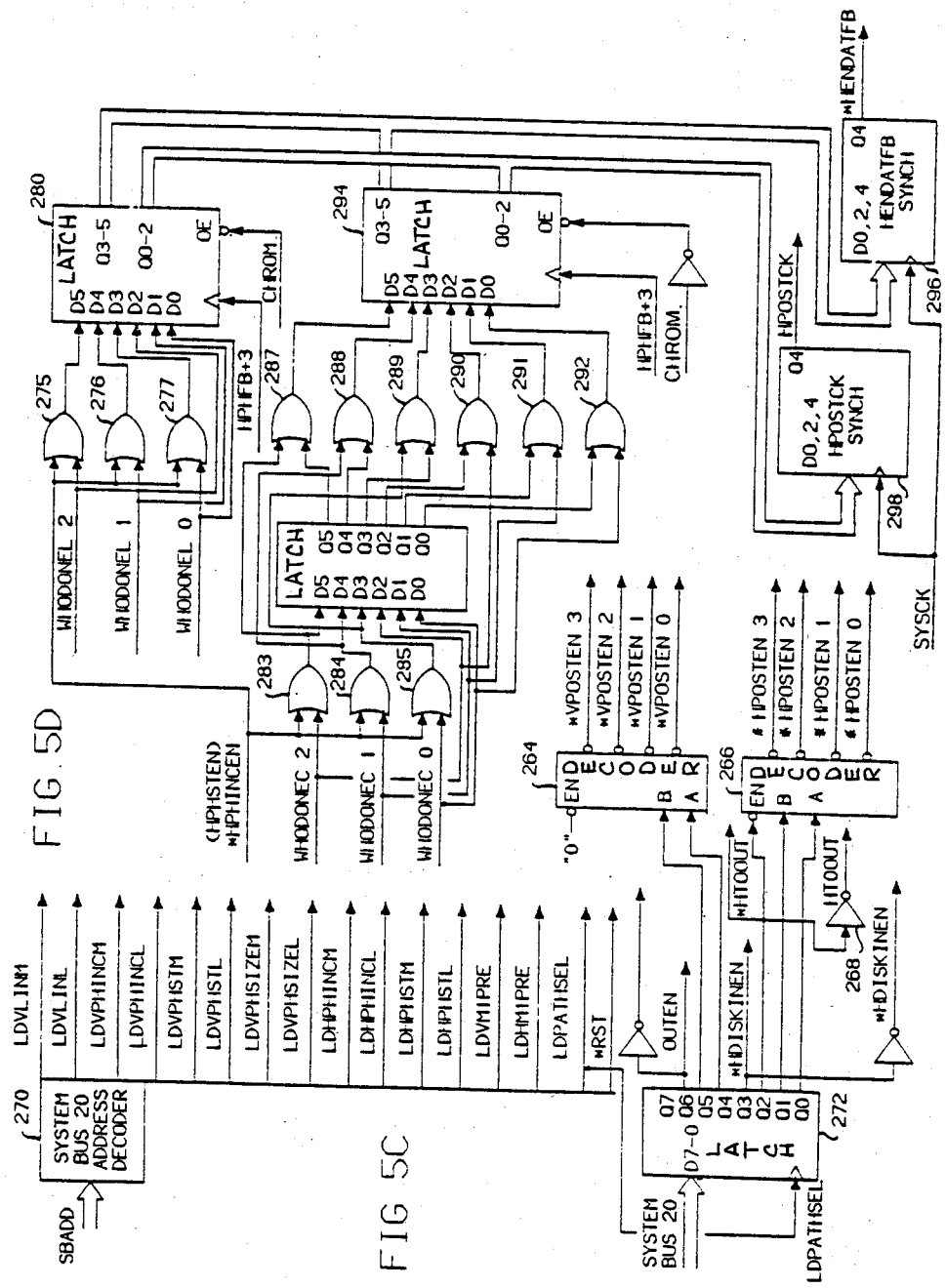

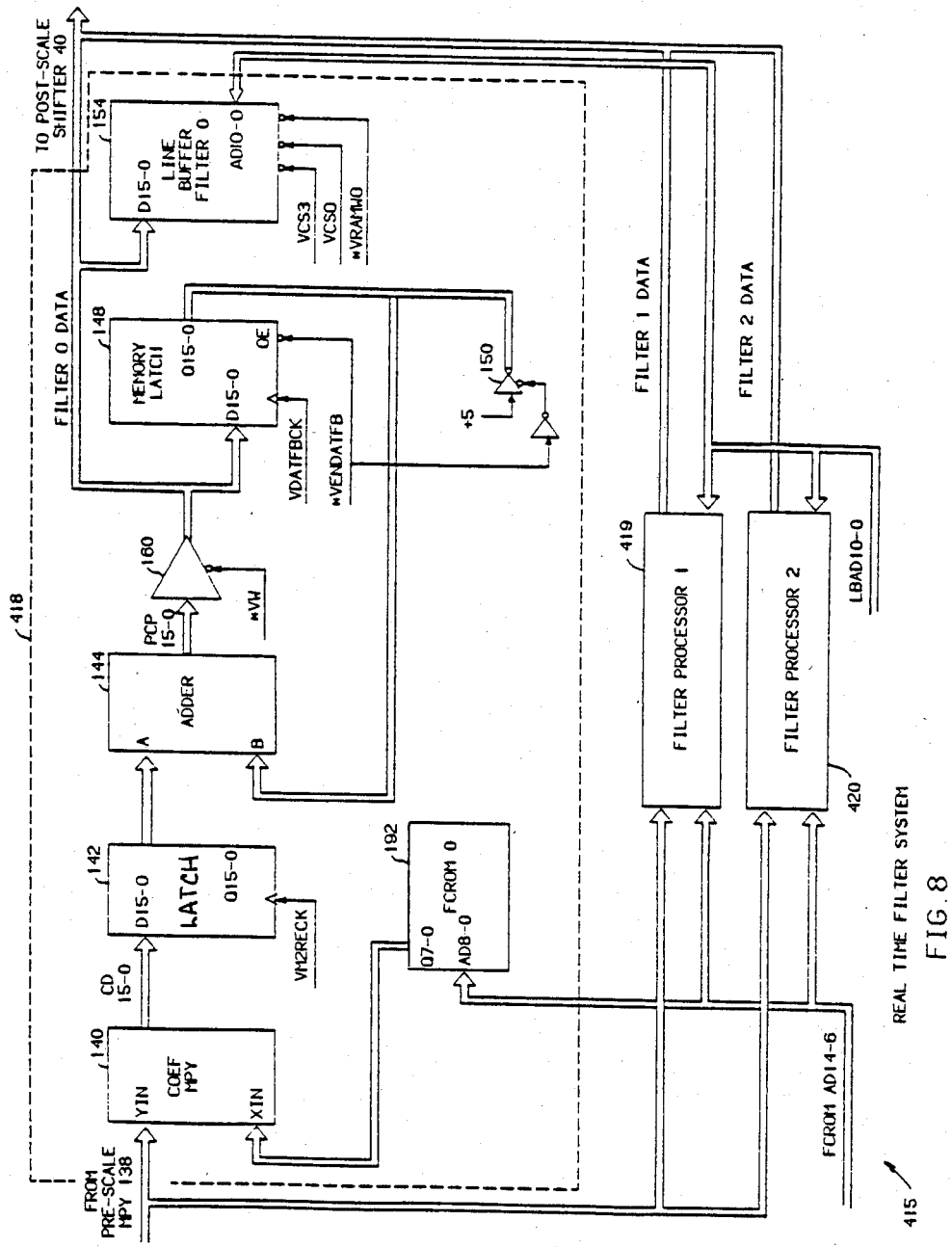
FIG. 8 REAL TIME FILTER SYSTEM

SYSTEM AND METHOD FOR TRANSFORMING AND FILTERING A VIDEO IMAGE

1. FIELD OF THE INVENTION

This invention relates to digital data transformation filters and more particularly to a transformation and filter system and method for television video data.

2. BACKGROUND OF THE INVENTION

Two processes are involved in manipulating or transforming an array of data such as a television video image which has been stored in a frame store. One process is that of addressing or moving the data values which represent the image at source image sampling points from their initial location in the source image to a transformed location in a target image. The other process is filtering.

Filtering is required to deal with data points within the transformed target image which fall between sampling points of the source image. That is, the target image must be structured as an array of target image sampled data points, each of which is derived from transformed source image data points which may fall between target image data points. In addition, if the size of the image is to be changed the source image must be low-pass filtered so that the transformed image will have a maximum frequency less than half the predetermined sampling frequency of the target image in order to satisfy the Nyquist sampling criteria. This is particularly true for image compression and failure to do so results in problems such as aliasing.

Frame stores are frequently used in video processing systems and store a video image as an array of pixels or digital values representing sampled data points. If a video image is received from an analog source such as a camera, it must first be periodically sampled and digitized and then written into a frame store as an array of pixels or data point values. If a stored image is to be transformed, as by compression, magnification, or translation most prior art systems pass a fixed length transversal filter over the data points in the source frame store prior to transformation. By using selected filter parameters, the cutoff frequency of the filter is varied to produce a progressively lower cutoff frequency as the amount of image compression increases. This effectively maintains the frequency of the target data below one-half the target data sampling frequency after compression. Oftentimes it is desired to present to a viewer an image which gradually decreases in size. However, during a gradual increase in the compression ratio of successive frames, new sets of filter parameters must be switched into the filter from time-to-time as the target image becomes progressively smaller. Each change of filter parameters results in an esthetically displeasing sudden change in the frequency response of the viewed target image. In addition, a very low cutoff frequency is required for highly compressed images. Because of cost, practical filters are limited to ten or fewer taps or sampling points. As image size decreases this translates into fewer and fewer sampling points in the transformed target image. As the target picture size falls below the minimum size that can be supported by the filter severe aliasing problems appear and picture quality rapidly deteriorates.

Known filter design theory holds that one should start by designing a hypothetical continuous reference filter with a cutoff frequency of one-half the sample frequency of the system, i.e. the sample frequency of the source image. This reference filter is then time-scaled by the inverse of the anticipated compression factor to obtain the proper filter for use in the source space. In other words the impulse response of the reference filter is "stretched" so that when compression occurs the original impulse response is recovered. The filter coefficients for a digital filter may be derived from this imaginary stretched continuous filter by sampling its impulse response at points coincident with a grid of source image sample points.

As the reference impulse response stretches in source space, it spans more and more grid points, requiring the filter to have many coefficients. For example, if the full-size image reference response lasted eight sample points, a 10:1 compression would require an 80-point filter and a 20:1 compression would require a 160-point filter. This would be economically impractical. Similarly, a full size image reference response that lasted four sample points would require 40-point and 80-point filters for compressions of 10:1 and 20:1 respectively.

Another technique for accommodating this problem is referred to as predecimation and is disclosed in application Ser. No. 310,907 (abandoned), filed Sept. 28, 1981 by Gabriel and Evans for "System for Spatially Transforming Images". The predecimation technique requires the successive generation and storage of multiple half-size copies of each line of a video image. Reduction to the required target size is then accomplished by selecting the smallest predecimated copy which is larger than the target size and providing the additional compression required to reach the final target size. This predecimation technique uses economically practical, highquality filters since the compression for any single filter pass is never greater than 2:1. However, in order to operate at real-time video rates predecimation requires expensive high-speed circuits connected for parallel operation. Furthermore, there is a visible discontinuity in the frequency response of the target image during a continuous change in the compression ratio as the system switches from one predecimated copy to the next predecimated copy.

In the present example a target image-referenced filtering system is illustrated in the context of a digital electronic still store for television pictures. A similar system using source image-referenced filtering is shown in U.S. Pat. No. 4,302,776 to Taylor et al, entitled "Digital Still Picture Storage System With Size Change Facility".

SUMMARY OF THE INVENTION

An image transformation filter system and method in accordance with the invention operates in target image space rather than source image space, and utilizes filtering techniques based on serial accumulators in place of fixed length transversal filters.

The effective length of such a filter is determined by how many source image points are summed, which is a function of system control parameters and can be made in principal arbitrarily large without concurrent expansion of hardware. In this application, the length of the filter is fixed, with respect to target space, at a small number, typically 3 to 8 target points. As the compression ratio of the source image increases, the number of source points which fall within this range increases proportionally. The accumulating filter is able to properly process all such points up to some preselected limit, typically in excess of 100 points.

To produce a complete target image from a single pass of source image data, a plurality of independent filters are required. If desired, several filters can share certain common hardware on a sequential time division multiplex basis to reduce hardware costs in a non-real time system. The number of filters required is exactly equal to the number of target points spanned by each individual filter, which is the previously mentioned small number between 3 and 8. If target image sample points are assigned to the filters one at a time in sequence, the filters can operate on a revolving basis to cover all target image sample points with an oldest assigned filter completing the accumulation of filtered video data for one target image sampling point and being available for reassignment just as the received source image data comes into the range of a next target image sampling point.

As each source video data point value is output, a coefficient address generator generates an address representing the transformed location of the source image point in the target image. This address may in general define a subpixel address location within the target video image. Each filter processor operates (sequentially in a non-real time system or in parallel in a high speed real time system) to derive from the address a value indicative of the displacement between the transformed or mapped address and the assigned target image sampling point. The displacement indication is then used to access a filter coefficient ROM storing, for selected displacement increments, filter coefficients corresponding to a predetermined filter impulse response function. The accessed filter coefficient is multiplied by the current source image data point value and the resulting filter product is summed in an accumulator.

Because both the number and value of the filter coefficients which generate a target data point value are dependent on the compression ratio and instantaneous target address position, the gain of the filter may be expected to vary with compression factor and source to target translation. Accordingly, the filter output must be continuously normalized to maintain unity gain. Because it is prohibitive to store all possible normalization factors for all sizes and positions in a lookup table, it is important that the filter be designed in such a way that the normalization factor is easily predictable to within some predetermined margin of error. Furthermore, to avoid calculating the factor on a point by point basis, it should be a function of size only, and not of position. This requires proper application of known filter theory.

Since data is received and processed at the source image video data rate, the frame rate of the transformation filter system remains constant. As the compression ratio increases more source image points are required to generate each target image point, but since there are fewer target image points the overall frame rate remains constant. Real time operation can be accommodated by double buffering successive fields of the target image so that a current target field is written into one buffer at the filter rate while the previous field is being read from the other at video rates.

More particularly an image compression filtering system in accordance with the invention includes video data source such as a frame store or magnetic disk store storing a source video image and sequentially outputting source data values representing the source video image in raster scan order, a given number, N, of filter processors, a coefficient address generator coupled to generate for each source data value the coefficient address corresponding thereto, a target frame store coupled to receive and store each target data value output by one of the filter processors.

Each filter processor is assigned in sequence to a different target video image data point and includes a coefficient store coupled to output a filter coefficient for a preselected filter function in response to a coefficient address that is indicative of a displacement within the target image between the target video image data point to which the processing stage is assigned and a location of a source data point transformed or mapped into the target video image. Each filter processor further includes a multiplier coupled to receive the value of each source data point and a corresponding filter coefficient and provide as an output the product thereof. An accumulator is coupled to sum a given number, M, of successive multiplier outputs representing M filter point products to generate a target point data value representative of the target video image point to which the filter processor is assigned. The number of M filter point products summed to generate a target point data value is approximately proportional to the reciprocal of the compression ratio. Each processor is coupled to output the accumulated sum and begin summing products for a new target data point when N target points have been spanned by the coefficient address generator and hence M filter point products have been summed.

Normalization of the summer filter products may be conveniently accomplished with a postscaling bit shift which divides the sum by an integer power of two and a prescaling multiplication of each source image data point value by a scale factor which, in combination with the postscaling bit shift, produces the required scale factor.

BRIEF DESCRIPTION OF THE DRAWINGS

A better understanding of the invention may be had from a consideration of the following Detailed Description taken in conjunction with the accompanying drawings in which:

FIGS. 3A, 3B and 3C are a block diagram and schematic diagram representation of a data path for a vertical filter shown in FIG. 1;

FIG. 4A is a graphical representation of vertical timing signals that are useful in understanding the operation of the still store system;

FIGS. 5A, 5B, 5C, 5D, 5E, 5F and 5G are block diagram and schematic diagram representations of a control system for a horizontal filter shown in FIG. 1;

FIG. 8 is a real time embodiment of the filter system shown in FIGS. 3A and 3B.

DETAILED DESCRIPTION

Figure 1:
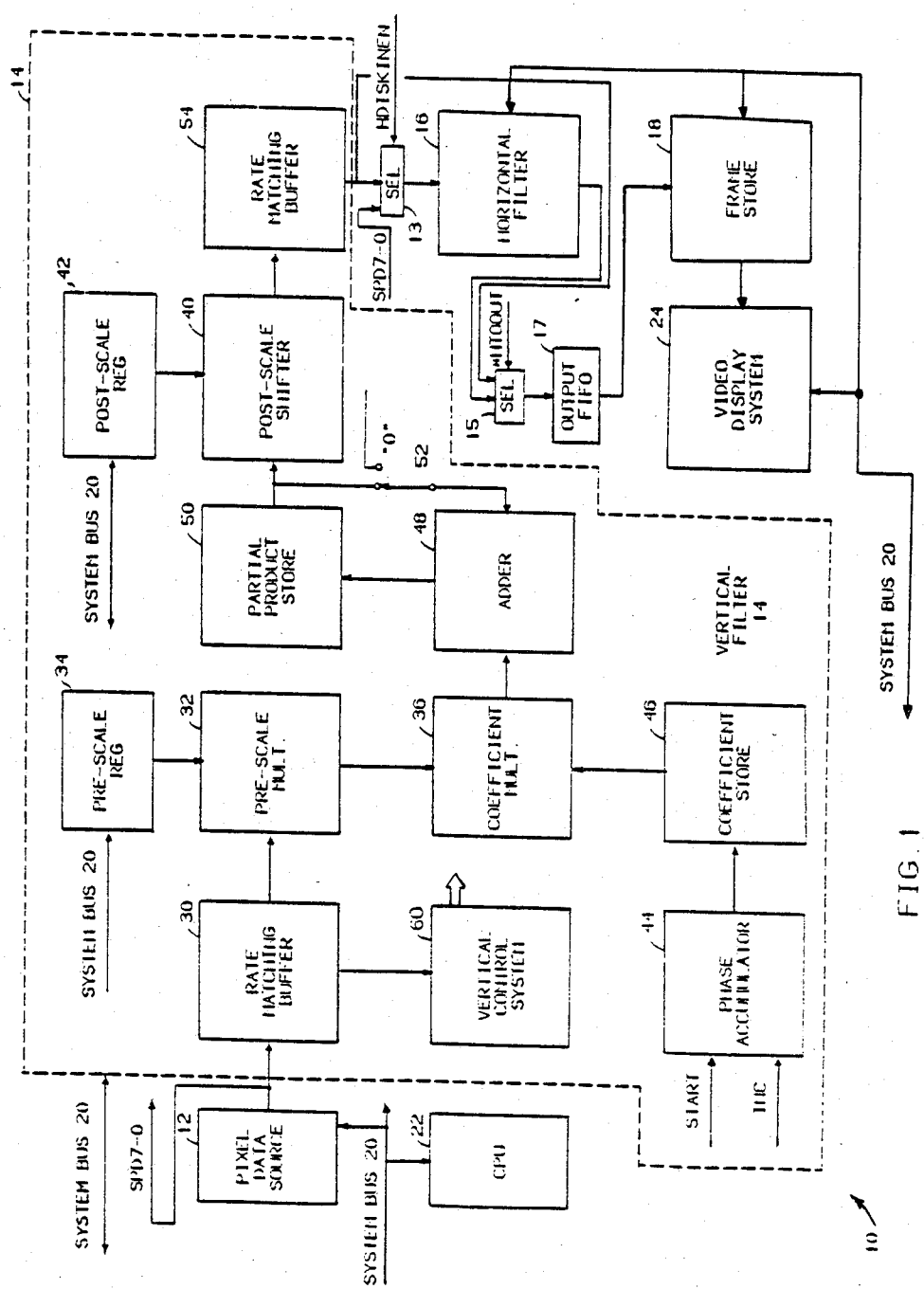
FIG. 1 is a block diagram representation of an electronic still store system using target image oriented horizontal and vertical filters in accordance with the invention.

Referring now to FIG. 1, a still store system 10 with a non-realtime target point determined filter system in accordance with the invention includes a pixel data source 12 such as a disk drive system storing predetermined video data and selectively outputting the video data in noninterlaced horizontal raster scan order to a vertical filter 14 which receives the pixel data from pixel data source 12 and performs a selected three target data point filter operation upon the data, a horizontal filter 16 which receives the vertically filtered data through a selector circuit 13 from either vertical filter 14 or directly from pixel data source 12 under control of mode control signal HDISKINEN. Horizontal filter 16 filter processes the data in a horizontal direction. An output FIFO 17 receives filtered data from a selector circuit 15 which operates under control of a mode control signal *HTOOUT to select data either from the output of vertical filter 14 or horizontal filter 16. The filtered data is communicated from output FIFO 17, the target address counter, to a frame store 18 which receives and stores the data pending access by a video display system 24. Thus, depending on the selected operating mode, video data reaching the frame store 18 may be filtered by vertical filter 14 only, horizontal filter 16 only or by both of the filters 14, 16.

While the filter technique of the present invention may be used in a variety of different fields and is advantageous wherever compaction of a target image occurs relative to a source image, the disclosed example is described in the context of a filter system for the electronic still store system 10. The electronic still store system 10 conventionally includes a system bus 20 which couples to various components of the system 10 for the purpose of communicating status and control information between the components thereof.

The system bus 20 is controlled by a CPU 22 which prior to each frame start time, generates and communicates mode control information to the system 10 component. After initialization by the CPU 22 generated mode control information, system 10 operates to process a frame of video information. A video display system 24 is coupled to access the filtered video data stored in frame store 18 and convert this data to a visible image or to integrate the image with a TV broadcast signal.

Horizontal filter 16 is not shown in detail in FIG. 1 but is described in greater detail below and is conceptually similar to vertical filter 14. However, horizontal filter 16 does have some implementation differences that result from the fact that the filter direction for vertical filter 14 is perpendicular to the raster scan direction and the filter direction for horizontal filter 16 is parallel to the raster scan direction. Both filters 16, 18 implement a predetermined number of filter points (3 in this example) in target image space. Frame store 18 may be conventional in nature and stores an array of pixel data for at least one frame of a video display.

The video input to vertical filter 14 includes a rate matching buffer 30 which includes a FIFO memory store which inputs data from pixel data source 12 at the data rate thereof (which can vary considerably from device to device) and outputs the selected data to a prescale multiplier 32 at a rate which is compatible with vertical filter 14 operating speeds.

A prescale register 34 receives a prescale value which is normally in the range of 0.5 to 1.0 from a CPU 22 over the system bus 20 while prescale multiplier 32 receives pixel data values from rate matching buffer 30 and multiplies these values by the prescale value stored by prescale register 34. The product is output to a coefficient multiplier 36.

Prescale multiplier 32 operates in conjunction with a postscale shifter 40 and its associated postscale register 42 which, like prescale register 34, receives a postscale value from the system computer over system bus 20. The postscale value stored in postscale register 42 is constrained to be an integral power of two so that postscale shifter 40 may be implemented as an inexpensive shifter. It will be recalled that shifting a value by N bit positions to the left corresponds to multiplication by $2^N$ while shifting a value by N bit positions to the right corresponds to division by $2^N$ or multiplication by $2^{-N}$. The product of the prescale value and the postscale value represents a total scale value which is equal to the compression factor or in alternative terms, the reciprocal of the source image:target image compression ratio. Extreme compression ratios beyond the capacity of the postscale shifter can result in the prescale value using less than 0.5 in order to attain the correct total scale value.

Because the number of target sample points is constrained to remain constant in the target image (three in the present example), the number of sample data points accumulated from the source image in order to derive a target image data point increases in proportion to the compression ratio. For example, for a one to one compression ratio there is one point in the source image for each point in the target image and each target image point is derived as the sum of three source image pixel values, each multiplied by a filter function value. The filter function values are selected such that at a one to one compression ratio the target data pixel value corresponds in magnitude to the source data pixel values. In other words, there is a D.C. gain of 1. As a simplified example, assume that a given set of source video data has a constant intensity magnitude of 10 over at least 3 pixels which are being sampled to derive a target image pixel value while the corresponding filter coefficients therefor are 0.2, 0.6, and 0.2. The filtered target pixel value then becomes $10 \times 0.2 + 10 \times 0.6 + 10 \times 0.2 = 10$ and is equal to each of the three source sample pixels which contribute to the target data value. However, if the compression ratio were to be 2:1 instead of 1:1, more source points would be summed. We might see, for example, the coefficient sequence 0.1, 0.2, 0.4, 0.6, 0.4, 0.2, 0.1. The corresponding target pixel data value is seen to be 20, not 10. The corresponding scale factor value of one-half would then normalize the derived target data value to a magnitude which corresponds to the source image data values.

By splitting the scaling function into a prescale function and a postscale function, the postscale function can be implemented as the inexpensive postscale shifter 40 while the prescale multiplier 32 compensates for any differences between the $2^N$ multiplication provided by postscale shifter 40 and the required actual scale value. At the same time, the prescale value may be constrained to a range between 0.5 and 1.0 so that at most only one significant binary digit is lost from the incoming source pixel data values and round off error within the vertical filter 14 is minimized.

As prescale multiplier 32 presents a prescaled source data value to coefficient multiplier 36 a phase accumulator 44 presents a corresponding address to a coefficient store 46. Phase accumulator 44, the source address counter, generates an address which corresponds to the position of the current source image sample data point relative to the source image point (not necessarily a sample point) which corresponds exactly to the target image point for which data is being developed. This address causes coefficient store 46 to output a corresponding filter coefficient value to coefficient multiplier 36. For a typical filter coefficient curve, the closer the current sample data point is to the location of the target image data point within the source image, the greater the coefficient value that is output by coefficient store 46. However, the exact value will depend upon the particular filter function which is selected and stored within coefficient store 46. Coefficient multiplier 36 computes the product of the prescaled source image sampled data value and the corresponding filter coefficient value and outputs the product to an adder 48.

Adder 48 operates in conjunction with a partial product store 50 to accumulate the sums of the multiple products associated with a target image pixel data value. As each new product is presented to adder 48 from coefficient multiplier 36, this new product is added to the sum of the previous products stored by partial product store 50 and the new sum is placed back into partial product store 50. This process continues sequentially until all of the partial products associated with a target image data point value have been summed. At this time the next occurrence of a product value from coefficient multiplier 36 activates a switching function which has been symbolically illustrated as a switching function 52 with the product for the next target image data point value being summed with a value of zero while the previously produced complete product sum for the preceding target data point value is output from partial product store 50 to postscale shifter 40.

Postscale shifter 40 completes the normalization of the target image data point pixel value and communicates the normalized value to rate matching buffer 54. Rate matching buffer 54 receives the target pixel data at the vertical filter 14 operating rate and outputs this data at a communication rate acceptable to the next element in the chain, which in this case is horizontal filter 16. At the conceptual level illustrated in FIG. 1, horizontal filter 16 is identical to vertical filter 14 except that it filters the data in the horizontal direction instead of the vertical direction. That is, all of the sample data points in the source image for a given target image data point lie on a horizontally extending line instead of a vertically extending line. After filtering and compression in the horizontal dimension by horizontal filter 16, the target image data points are communicated to the frame store 18 where they are stored as an array of target image data point values which may be selectively output to a video display system.

The target determined filter system may be conceptualized as a resilient window which extends across a selected number of sample data points in a target image. The number of sample data points is three for the present example. This resilient window is then stretched to cover the same target data points as they are mapped back onto the source image. For example, for a compression ratio of 2:1, the three target image data points would map back into six source image data points and the resilient window would in effect stretch to include six source data points within the window. For a compression ratio of 4:1, 12 source data points would fall within the window and the resilient window would stretch to encompass 12 points within the source video image. Because the number of sampled data points at the target image remains constant irrespective of the image compression ratio, the image quality does not decrease as the compression ratio increases.

While the implementation of the target image aligned filter function is conceptually straight forward, the implementation becomes somewhat complicated by the order in which video data is received from pixel data source 12 and for the vertical filter 14 by the fact that data is received in horizontal scan line order while the filter dimension extends vertically. This necessitates storage by vertical filter 14 of three lines of partial product data, each corresponding to a different line of target image data points within the target image and with each line corresponding to a different filter processor.

The still store system 10 processes video data in a three color component format with each component represented by an eight bit byte or data. The three components are luminence which will be designated Y, Red-Y, which will be designated R, and Blue-Y, which will be designated B. The source image data point values are received in the order $Y_1, R_1, B_1, Y_2, Y_3, R_3, B_3, Y_4$ and so forth. In the horizontal direction the chroma resolution is only half the intensity resolution. R and B chroma values are provided only for the first and then alternate intensity values (y). This means that the filters 14, 16 must include circuitry for keeping track of which type of video data is currently being processed to avoid adding an intensity pixel value to a red or blue chroma partial product value. In the vertical direction the intensity and chroma resolutions are equal so that the data pattern for each line is the same.

Figure 2:
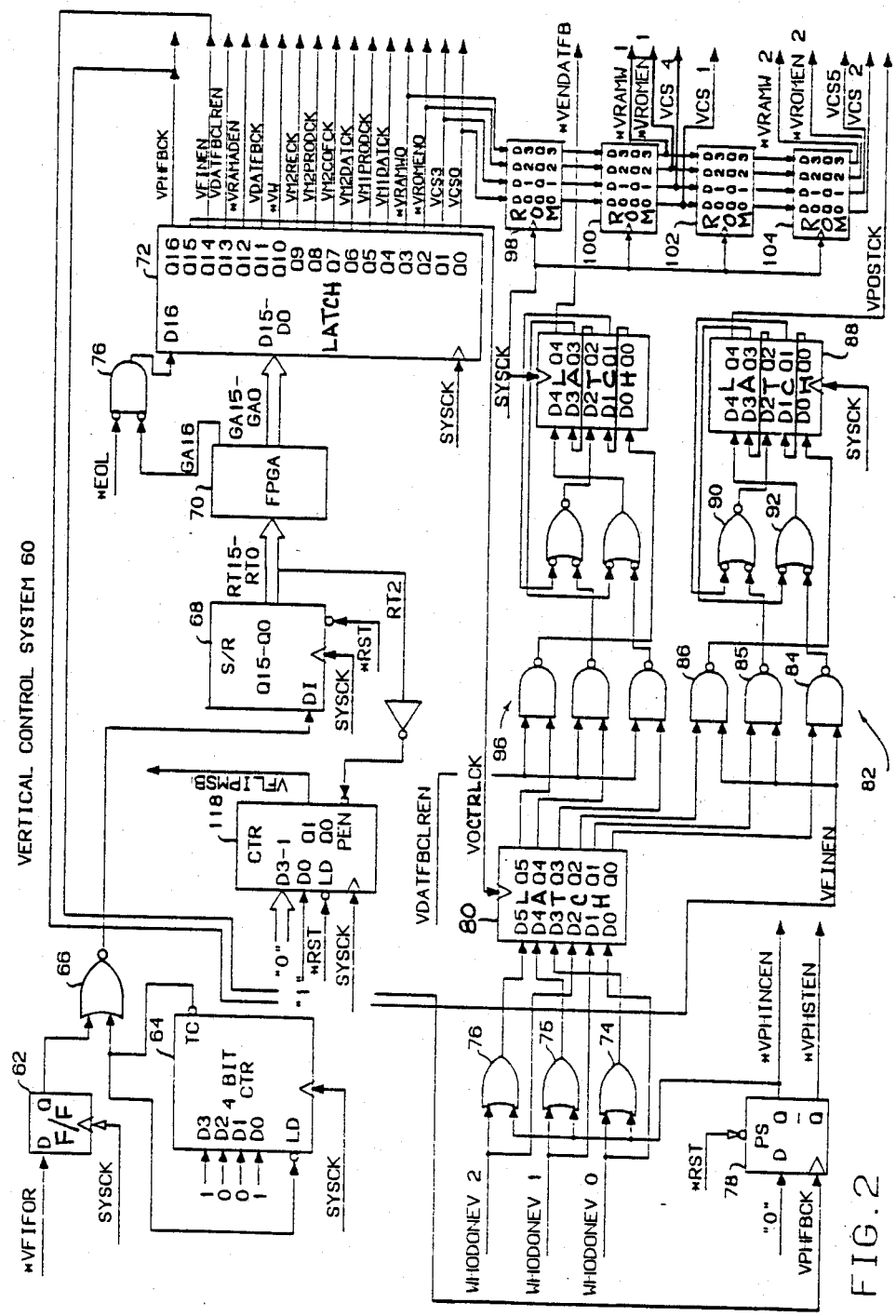
FIG. 2 is a block diagram and schematic diagram representation of a control system for a vertical filter shown in FIG. 1.

As illustrated in FIG. 2, the vertical control system 60 for vertical filter 14 responds to synchronizing control signals and generates internal control signals which assure that the proper responses are made by vertical filter 14 at the proper time.

The timing and control signals for operating the vertical filter 14 are generated by a vertical control system 60 which in turn operates under control of a 13.5 MHz square wave master clock signal referred to as system clock, SYSCK. A signal vertical FIFO ready, *VFIFOR, ("*" implies an inverted or active low signal state) is received at the D input of a flip-flop 62 and indicates that the rate matching buffer 30 has received a pixel of video data from data source 12 which is ready for processing by vertical filter 14. A 4-bit anti-bunching up counter 64 is connected to sequentially and repetitively count from 10 to 15. As counter 64 reaches a count of 15, its terminal count output is connected to a NOR gate 66 which has a second input connected to the Q output of flip-flop 62. Upon the concurrence of latched signal *VFIFOR and *Terminal Count from counter 64, NOR gate 66 passes a logic 1 signal which is referred to herein as a "token" to the data input of a 16 bit shift register connected data latch 68. Because signal TC from counter 64 becomes active low only once every seven cycles of signal system clock, NOR gate 66 is enabled to initiate the processing of a next pixel of source video data only once every seven clock cycles. This assures that successive pixel data bytes cannot be crowded together closer than seven clock cycles apart as they are passed through the pipeline processor type circuitry of the data path for vertical filter 14.

Shift register 68 passes each token or logic 1 bit sequentially through the 16 shifting stages thereof beginning with stage 0 under control of signal SYSCK. As the token enters a given shift stage, it causes the corresponding output signal RT15-RT0 to be activated to state logic 1 and thus indicate the presence of the token at that state. As the token associated with a given pixel shifts through the shift register 68, there are thus 16 processing states which may be associated with the given pixel as the pixel is pipelined through the data path of vertical filter 14. Since the shift register 68 represents 16 discrete states, and each token must be separated by a minimum of seven discrete states, up to three tokens may be active within shift register 68 at one time, thus corresponding to the simultaneous processing of three different pixels of source video information by vertical filter 14 at any given time.

Field programmable gate array 70 responds to the activation of shift register state signals RT15-RT0 to generate 17 gate array master timing signals designated GA16-GA0. Gate array 70 is nothing more than a large block of combinational logic which causes each of its 17 output signals to become active high at predetermined times indicated by the shift register timing signals RT15-RT0.

When a given timing state is output by shift register 68 in response to the occurrence of a token therein, the corresponding control states output by FPGA 70 are latched by data latch 72 one system clock pulse time later. As a frame of reference, system clock pulse periods occurring at the output of latch 72 will be referred to as time cells 0-16 which will be delayed by one clock pulse period with respect to corresponding timing states RT15-RT0 occurring at the output of shift register 68.

The signals output by latch 72 are summarized as follows:

Q0-VCS0—Vertical component select 0. This signal goes active low at time calls 6 and 7 to select one of two memory components comprising line buffer filter zero when enabled by a most significant address bit.

Q1-VCS3—Vertical component select 3. This signal is active high at time cells 6 and 7 to select a second of two memory components comprising line buffer filter zero when enabled by a most significant address bit.

Q2-*VROMEN0—*Vertical ROM Enable 0. This signal goes active low at time cells 2 and 3 to enable the coefficient ROM store 46 for filter processor 0 to output a filter coefficient value.

Q3-*VRAMW0—*Vertical RAM Write 0. This signal goes active low at time cell 7 concurrently with signal *VW to control the writing of a partial product sum for filter processor 0.

Q4-VM1DATCK—Vertical multiplier 1 data clock. A clock signal to load a byte of video data into pre-scale multiplier 32 during time cell θ.

Q5-VM1PRODCK—Vertical multiplier 1 product clock. A clock signal to load the calculated prescale product into the output latch of prescale multiplier 32 during time cell 2.

Q6-VM2DATCK—Vertical multiplier 2 data clock. A signal which loads the prescaled data value into the Y input latch of coefficient multiplier 36 during time cell 3.

Q7-VM2COFCK—Vertical multiplier 2 coefficient clock. A signal which loads the filter coefficient value into the X input latch of coefficient multiplier 36 during time cells 3, 5 and 7.

Q8-VM2PRODCK—Vertical multiplier 2 product clock. A signal which loads the calculated coefficient product value into the output latch of coefficient multiplier 36 during time cells 5, 7 and 9.

Q9-VM2RECK—Vertical multiplier 2 result clock. A signal loads the coefficient product into a holding latch at time cells 6, 8 and A (Hex).

Q10-*VW—*Vertical Write. A signal which places a sum of coefficient products data from adder 48 onto the memory data bus for partial product store 50 during time cells 7, 9 and B.

Q11-VDATFBCK—Vertical data feedback clock. A signal which loads partial sum coefficient data from partial product store 50 into a memory data buffer latch by going low during time cells 7, 9 and B.

Q12-*VRAMADEN—*Vertical RAM (coefficient store 46) address enable. A signal which goes active low during time cell 5 to enable the decrementing of a line length counter which controls end-of-line functions and the incrementing of a modulo 4 counter which defines the current state of the luminance, chrominance, luminance (LCCL) repeating sequence of input data bytes.

Q13-VDATFBCLREN—Vertical data feedback clear enable. A signal which enables a filter processor finished portion of vertical control system 60. This signal is high for time cells 5 and 6.

Q14-VFINEN—Vertical finish enable. A signal which enables a filter processor finished portion of vertical control system 60. This signal is high for time cell 5.

Q15-VOCTRLCK—Vertical output control clock. A signal which clocks a latch to control the generation of control signals related to the completion of a filter operation. This signal is high for time cell 3.

Q16-VPHFBCK—Vertical phase feedback clock. A signal which clocks a flip-flop within vertical control system 60 to control the generation of signals which in turn control whether the address register for the coefficient store 46 is advanced or restarted. This signal goes active high during time cell 1, but only when enabled by an end of line signal *EOL.

The lower portion of FIG. 2 includes digital logic coupled to control special processing that is required at the start of a frame and upon the accumulation of all of the partial coefficient products for a given filter process. Coefficient store address circuitry located as part of the vertical data path keeps track of the relative progress of each filter processor and generates a who done V0-2 signal for each of the three filter processors respectively when a complete set of filter processing has been completed. These three who done V0-2 signals are coupled as one input to each of three two-input OR gates 74, 75, 76. The second input to OR gate 74, 75, 76 is a signal *VPHINCEN, vertical phase increment enable, which is generated at the Q output of a flip-flop 78. The D input of flip-flop 78 is connected to 0 while the preset input is connected to the system reset signal so that flip-flop 78 becomes preset in response to the reset signal which is generated prior to the start of processing for each new frame of data. The clock input to flip-flop 78 is connected to a signal VPHFBCK, vertical phase feedback clock, which goes active low at time cell 7 and then returns high at the beginning of time signal 8 of the first pixel of the second line to reset flip-flop 78 to 0 and cause signal *VPHINCEN to go active low. The $\overline{Q}$ output of flip-flop 78 generates a signal VPHSTEN, vertical phase start enable, which is the complement of signal *VPHINCEN.

A six bit latch 80 receives as a first set of three input signals the three WHODONEV0-2 signals and as a second set of three signals, the outputs of OR gate 74, 75, 76 which represent the ORing of the three who done signals with the *VPHINCEN signal. Latch 80 is clocked by signal VOCTRLCK, vertical output control clock generated by the Q15 output of latch 72 which goes active high at the beginning of time cell 3 to cause latch 80 to sample the six inputs thereto. The outputs Q0-Q2 of latch 80 thus indicate whether or not a given filter process is complete while the Q3-Q5 outputs indicate either that the filter process is complete or that a first line of data is being processed by the vertical filter 14. These conditions indicate that the partial products must be cleared.

A synchronizing circuit 82 receives the Q0-Q2 outputs of latch 80 through three two-input NAND gates 84, 85, 86.

A five-bit shift register connected latch 88 has its D0 input coupled to the output of NAND gate 86. The D2 input of latch 88 is coupled through an AND gate 90 which operates to selectively pass on the output from stage Q1 or input the output of NAND gate 85 if that output is active low. A NAND gate 92 is coupled to receive the output from stage Q3, inverted and presented to the D4 input. A NAND gate 92 also selectively receives and inverts the output of NAND gate 84 when that output is active low. The Q4 output of latch 88 generates a signal VPOSTCK, V postscaler clock, which controls the operation of post-scale shifter 40. The synchronizing circuit 82 thus receives the three who done signals for the three filters, and in response to the VFINEN, vertical finish enable, signal at time cell 6 presents the who done signal as an output labeled VPOSTCK with a delay of 1, 3 or 5 time cells corresponding to the respective filter processors 0, 1 and 2.

A synchronizing circuit 96 is essentially the same as synchronizing circuit 82 except that it is coupled to the Q3-Q5 outputs of latch 80 to receive the three signals who done V0-2 ORed with signal *VPHINCEN. The output at Q4 is designated *VENDATFB, vertical enable data feedback.

A pair of latches 98, 100 sequentially receive the four outputs Q0-Q3 from latch 72 which controls the operation of filter processor 0, delay each of those signals by a two time cell period corresponding to the multiplier calculation delay, and output four corresponding signals VCS1, VCS4, *VROMEN1, and *VRAMW1 for filter processor 1. Similarly, a pair of latches 102, 104 sequentially receive the four outputs from latch 100 and provide an additional two time cell delay before outputting the corresponding signals VCS2, VCS5, *VROMEN2, and *VRAMW2 for controlling operations for filter processor 2. However, synchronizer 96 is gated by signal VDATFBCLREN, which becomes active during time cells 5 and 6. Signal *VENDATFB, vertical enable data feedback, which is generated by synchronizer 96 with 1, 3 and 5 cell delays for filter processors 0, 1 and 2 respectively is thus subject to either state during time cells 6-B (hexidecimal). This signal determines whether a current coefficient product is added to a previously accumulated partial sum or to zero to begin processing for a new data point value.

Figure 3A:
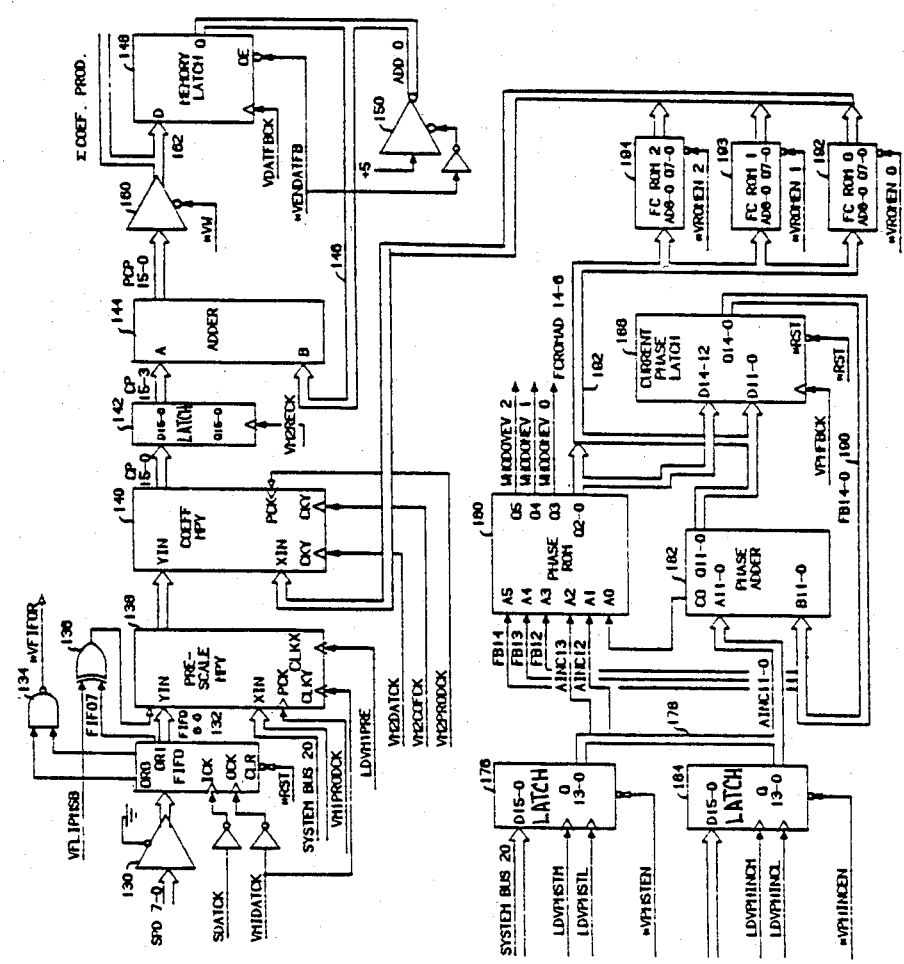

The vertical filter processor data path for filter 14 is shown in FIG. 3A and 3B to which reference is now made. The sequential bytes of input pixel data from source 12 are passed through a buffer 130 to a FIFO stack 132. The data is accompanied by a source data clock signal, SDATCK, which loads the pixel data into FIFO 132. The FIFO 132 is implemented with two parallel sections whose output ready signals OR0, OR1, are sampled by a NAND gate 134 to generate a signal vertical FIFO ready, *VFIFOR, when a byte of data has been stored by FIFO 132 and is ready for filter processing. As shown in FIG. 4, to which further reference is now made, this signal becomes a start command for a sequence of operations which is performed on the byte of video pixel data.

An Exclusive-OR gate 136 receives and selectively inverts the most significant bit, FIF07 of the FIFO 132 output byte. This bit corresponds to the sign bit for chrominance bytes which are received in a signed two's complement negative number representation. A signal VFLIPMSB, V flip most significant bit, is generated by the Q1 output of a binary counter 118 (FIG. 2) to indicate that a chrominance byte of data is being processed. It will be recalled that the data encounters a repetitive four state sequence of luminance, chrominance, chrominance and luminance with luminance data having twice the horizontal spatial resolution of chrominance data. Counter 118 is preset to a state of 1 and incremented at time cell 2 for each byte of pixel data that is processed. The Q1 output of modulo 4 counter 118 thus goes high in concurrence with the receipt of chrominance data to cause the inversion of the sign bit and conversion from a signed two's complement negative number representation to a converted representation in which sequential data values from 0 to 255 correspond to a monotonically increasing set of values for the video data. This enables the chrominance data to be processed as unsigned positive values and to later be converted back to signed two's complement form.

During the operation of vertical filter system 14, CPU 22 resets the filters 14, and 16 prior to the receipt of any video pixel data by using system bus 22 to load mode selection parameters and generate the system reset signal, *RST. Upon receipt of a byte of pixel data, the FIFO stack circuit 132 generates the output ready signals, which can cause NAND gate 134 to generate signal *VFIFOR at time cell −2. Signal VFIFOR is latched by latch 62 (FIG. 2) upon the occurrence of the next SYSCK signal at time cell −1. For the sake of convenience, it will be assumed that four bit counter 64 reaches its terminal count of 15 simultaneously with the loading of latch 62 at the beginning of time cell −1. The concurrence of these two signals (there might in fact be a time delay between the occurrence of signal *VFIFOR at time cell −2 and the terminal count signal at time cell −1) enables a NOR gate 66 to load a token into the vertical master timing shift register 68 at the beginning of time cell 0. This loading of the token corresponding to the first byte of video data defines the occurrence of time cell 0. At time cell 0, signal VM1DATCK is generated to load the first pixel of video data into the Y input latch of a prescale multiplier 138 and to pop the first pixel off of the FIFO stack within FIFO stack circuit 132.

Prescale multiplier 138 has stored in the X input latch thereof a prescale normalizing value between 0.5 and 1.0 which was loaded from system bus 20 in response to a decoded address signal LDVM1PRE, load vertical multiplier one prescale value, during system initialization and prior to the receipt of the first pixel data byte.

During the two clock periods designated TC0 and TC1, time cell zero and one, multiplier 138 calculates the product of the first input pixel data value and the prescale value so that this product may be loaded into an output latch of prescale multiplier 138 upon the receipt of signal VM1PRODCK, vertical multiplier 1 product clock, at the beginning of time cell 2.

The prescaled value thus becomes available at the output of prescale multiplier 138 during time cell 2 and at the beginning of time cell 3 signal VM2DATCK, vertical multiplier 2 data clock, is generated to load the prescaled pixel data into a set of Y input latches for a coefficient multiplier 140.

Also during time cell 3, signal VM2COFCK, vertical multiplier 2 coefficient clock, is generated to load a filter coefficient value into the X input latch of coefficient multiplier 140. During time cells 3 and 4 coefficient multiplier 140 operates to calculate the product of the prescaled pixel data value and the filter coefficient value for filter processor 0 to generate a partial coefficient product value which is loaded into an output latch at the start of time cell 5 in response to a signal VM2PRODCK, vertical multiplier 2 product clock. Signal VM2COFCK, vertical multiplier 2 coefficient clock, is then again generated during cell time 5 simultaneously with signal VM2PRODCK to load a second filter coefficient corresponding to filter processor number 1 into the X input latches of coefficient multiplier 140. At the start of time cell 6 a signal VM2RECK, vertical multiplier 2 result clock, transfers the partial coefficient product for filter 0 to a holding latch 142. During time cells 5 and 6 coefficient multiplier 140 calculates the product of the first prescaled pixel data value and the coefficient value for filter 1 with this product being latched at the output thereof at the beginning of time cell 7 in response to signal VM2PRODCK for the partial product 1 of filter processor 1.

The process is then repeated a third time for the third filter processor (processor 2) with the filter coefficient for filter processor 2 being loaded into the X input of coefficient multiplier 140 at time cell 7 in response to signal VM2COFCK, vertical multiplier 2 coefficient clock, as the previously calculated filter 1 partial product is latched by the output latch of coefficient multiplier 140 in response to signal VM2PROCK. The vertical filter 14 data path thus operates as a sequential pipeline in non-realtime to sequentially process the single byte of input video data for three sequentially phased filters, each corresponding to a different sample data point in the target space. Latch 142 is further clocked at time cells 8 and A under control of signal VM2RECK to load the partial product data for filters 1 and 2. The three partial product values are sequentially communicated from the output of latch 142 to an A input of an adder 144. Thirteen significant bits designated CP15-3 of partial product data are presented to the A input of adder 144. The B input to adder 144 is driven by an adder bus 146 which is coupled to the output of a memory latch 148 and also to an inverter buffer 150. Signal *VENDATFB, vertical enable data feedback, alternatively enables memory latch 148 or inverting buffer 150. During normal operation, memory latch 148 receives partial coefficient product sum data from three sequentially accessed line buffers 154, 155 and 156 for filters 0, 1 and 2 respectively and latches the accessed values for presentation to the B input of adder 144. However, at frame start and upon the completion of processing for a given target image data point, signal VENDATFB goes high to enable buffer 150 to present logic 0 data onto the adder bus 146 so that as processing for a new filter data point begins, the coefficient product for the first data value is added to 0 and not influenced by the data left over in the corresponding line buffer 154-156 from processing for the previous target image data point. The effect of the outputting of logic 0 data onto data bus 146 is the outputting of the accumulated product which corresponds to each output data value when the filter coefficients that are associated with all further input digital values are equal to zero, such that the filter coefficient is established at zero for displacements greatere than the selected maximum magnitude and source data vlaues for points having a displacement with respect to a given point in the target array are ignored when generating the associated target data value.

The 16 bit output of adder 144 designated PCP15-0 is communicated to a non-inverting buffer 160 whose output is enabled in response to signal *VW, vertical write, at time cells 7, 9 and B for filter processors 0, 1 and 2 respectively. The enabling of buffer 160 presents a sum of partial product values to a memory data bus 162 which couples to the D input of latch 148 and also to the data input/output of the three line buffers 154-156. Memory data bus 162 also connects to the postscale shifter 40. Thus, upon the completion of processing for a given target image filter data point, the recalled data from one of the line buffers 154-156 can be written into postscale shifter 40 instead of feeding back to adder 144. Upon the completion of processing for a given target image data point, signal VPOSTCK, vertical postscaler clock, goes active high at time cells 7, 9 and B for filters 0, 1 and 2 respectively to load data into postscale shifter 40. A set of four signals provided by the CPU during pre-frame initialization are designated *VPOSTEN3-0 and control the shifting of postscale shifter 40 to provide in effect division by 0, 2, 4 or 8. Postscale shifter 40 is conveniently implemented as four latches with the inputs thereto connected to the sum of coefficient product bus 162 with a shifted offset of 0, 1, 2 or 3 bit positions for the four respective latches to attain the desired shifting effect. One of the four signals *VPOSTEN3-0, vertical postscaler enable 3-0, simply enables the output of a selected one of these four latches to drive an output bus 164 so as to attain the desired number of bits of shifting to the right.

The postscale shifter output bus 164 connects to a pair of buffers 166, 168 which connect the most significant eight bits from postscale shifter 40 to respectively the horizontal filter input on a bus designated DIN7-0 or to the horizontal filter 16 output FIFO 17 on a bus designated data output, DOUT7-0. The most significant or sign bit must be complemented for the chrominance data to return it from the converted format to the signed two's complement negative number representation in which it was received. A signal, vertical output flip most significant bit, VOFMSB, is generated whenever a chrominance byte is being output. Signal VOFMSB is communicated to an Exclusive-OR gate 170 which also receives and selectively inverts the most significant or sign bit on bus 164.

A phase start latch pair 176 receives from system bus 20 during initialization time, data defining the starting phase for the filter coefficient memories. Latch 176 is implemented in two parts with a most significant byte being loaded in response to system address bus decode signal LDVPHSTM, load vertical phase start most significant byte and with a least significant byte being loaded in response to the system address bus decode signal LDVPHSTL, load vertical phase start least significant byte. The output of latch 176 is placed onto a phase adder input bus 178 under control of a signal *VPHSTEN, vertical phase start enable. Only the fourteen least significant bits Q13-Q0 from latch 176 are communicated to the phase adder input bus 178. The phase start word stored in latch 176 in effect defines the fourteen least significant bits of the starting address for filter processing within the source video image with the binary point occurring between bits 13 and 12. The fourteen bits on input bus 178 are designated AINC13-AINC0. The two most significant bits AINC13 and AINC12 are communicated to the A1 and A2 address inputs of a phase ROM 180 while bits AINC11-0 are communicated to the A input of a phase adder 182.

The phase start value enables the source image vertical starting point to be selected within a one pixel range. The one pixel range is determined by selecting the source image position at which the first pixel data value is communicated to vertical filter 14.

A phase increment latch 184 is the counterpart to the phase start latch 176 and stores an initialized value indicating the amount by which the filter phase is to be incremented for each pixel value. The data inputs to latch 184 are connected to system bus 20 and the two one byte portions thereof are clocked by the address decode signals LDVPHINCM, load vertical phase increment most significant byte and LDVPHINCL load vertical phase increment least significant byte. The output of latch 184 is enabled in response to signal *VPHINCEN, vertical phase increment enable. The increment value stored by latch 184 is in effect the reciprocal of the compression ratio. That is, if an image is to be compressed by the ratio of 2:1 as it is being processed, the latch 184 will be initialized with a value of 0.5. The output of latch 184 is coupled to the adder input bus 178. Since the phasing for the vertical filter changes only at the end of each line of pixel data, the phase circuitry need be initialized only prior to frame start with no further initialization required until a new frame of video data is to be processed.

A current phase latch 188 is reset prior to frame start as part of the initialization process and has its output connected to an FB bus 190 designated FB14-0. Signals FB11-0 are connected to the B input of phase adder 182 while signals FB14-12 are connected to the A5, A4 and A3 address inputs respectively of phase ROM 180. A C0 carry output from phase adder 182 is connected to the A0 address input of phase ROM 180. The three least significant output bits designated Q2-Q0 of phase ROM 180 are programmed as the three most significant bits of an adder to operate in conjunction with phase adder 182 to generate a 15 bit address signal which is communicated to an FC ROM address bus 190 and to the D14-0 inputs of current phase latch 188. The contents of phase ROM 180 are presented in Table I in hexadecimal representation and numerical address order. Note that in the present configuration only the 6 least significant address inputs are used and only the first 64 word locations represent useful data.

In operation, at the start of each frame, current phase latch 188 is set to 0 and this value is added by phase adder 182 to the phase start value stored by latch 176. The sum of the phase start value plus 0 is presented to the current phase latch 188 and also to the three filter coefficient ROMs designated FCROM0-2, 192, 193 and 194 respectively. At the end of the first line of video data, the output of latch 176 is disabled while the output of phase increment latch 184 is enabled to permit the increment value to be added to the start value which is now stored by current phase latch 188. Thereafter, the value stored by current phase latch 188 is incremented by the value stored in phase increment latch 184 at the end of each line of input source data.

The binary point for the phase address lies between bits 13 and 12. The carry input into address position of phase ROM 180 corresponds to bit position 12. Bits 12-0 represent fractional or subpixel bit positions and are added (or "counted") in a normal binary manner. However, because the vertical filter 14 spans three pixel locations in target image space and is scaled for a 1:1 size ratio (with different size ratios being accounted for by storing a nonunity increment value in latch 184), the filter also spans three pixel positions in source image space. The integer bits 14 and 13 are therefore required to "count" on a modulo 3 basis following the pattern 0, 1, 2, 0, 1, 2, 0, etc.

The three most signficant bits Q5-Q3 of phase ROM 180 are programmed to indicate the phase points at which processing is completed for the three filters and correspondingly generate signals WHODONEV2-0.

Figure 4B:
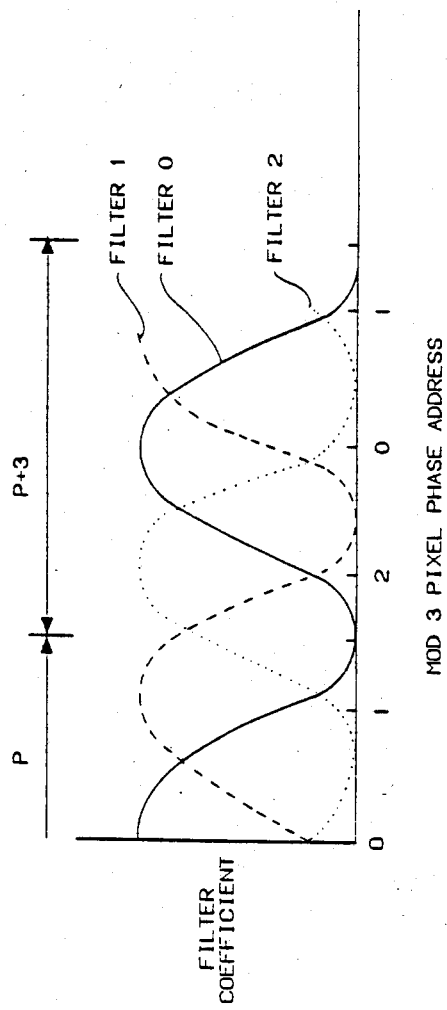
FIG. 4B is a graphical representation of a filter coefficient value used in the system shown in FIG. 1.

As illustrated in FIG. 4B, the filter coefficient functions stored in filter coefficient ROM, 192-194 define a generally bell-shaped curve with a peak value of hex CC and a minimum value of 0. Placing the binary point to the left of the most significant output Q7 produces a translation to decimal values 0.797 and 0 respectively. At unity size ratio the filter coefficient curves can be thought of as periodic functions with a period of 3. Each target image sample data point maps into a source image point and conceptually a window extends 1.5 pixel points (corresponding to 1.5 lines in the vertical direction) on either side of the mapping point. In order that the filtered target image data value will be most influenced by the source image values nearest the mapping point, the filter coefficient function is aligned with its peak in the middle of the window and with minima at the left and right edges of the filter window. Reducing the phase increment parameter as the size ratio increases produces the effect of scanning an increasing number of pixels in source image space. In any event, each minimum of the periodic filter coefficient filter function represents a boundary between the right edge of a window for a given target image sample data point, p, and the left edge of the window for the next target image data point, p+3, which is processed by the same filter processor.

The signals WHODONEV2-0 are thus generated as the modulo 3 pixel phase address is incremented past the minimum point of the corresponding filter coefficient function. For filter zero, the coefficient curve is phased with a peak at address zero and the minimum at pixel address 1.5 (binary address 15 × 128 1 = 19). Phase ROM 180 is thus loaded to make the Q3 output (signal WHODONEV0) active high when the modulo 3 current pixel phase address exceeds a value of 1.5 but by an amount less than the phase increment value as indicated by the AINC13-12 signals input to address inputs A2, A1 of phase ROM 180. This assures that signal WHODONE0 is generated for exactly one line time each time the pixel phase address is incremented past a window boundary.

The WHODONEV1, 2 signals are generated in a similar manner, but with the phase relative to the pixel phase address shifted to reflect the relative phase position of the corresponding filter coefficient curve. The filter coefficient curve for filter 1 is delayed by one pixel position relative to the filter coefficient curve for filter 0 with a peak at pixel phase address 1 (binary address 128) and a minimum defining the righthand edge of a window at 2.5 (binary address 2.5×128 1 =319). Signal WHODONEV1 is thus generated during the first increment after the pixel phase address equals or exceeds 2.5 on a modulo 3 basis (that is, the range 3.0–3.5 maps into the range 0–0.5).

Similarly, the filter coefficient curve for filter 2 is delayed by two pixel positions relative to the filter coefficient curve for filter 0. The coefficient curve for filter 2 has a peak at pixel phase address 2 (binary address 256) and a minimum defining the righthand edge of a window at 0.5 (binary address 0.5×128 1=63). Signal WHODONEV2 is thus generated during the first increment after the pixel phase address equals or exceeds 0.5.

The three filter coefficient ROMs 192, 193, 194 store filter coefficient values for the three filters 0, 1 and 2 respectively. The data in the three ROMs is essentially the same except for the phase relationship. Therefore only the filter coefficient values for filter 0 are set forth in Table II in a hexadecimal representation and in binary address column order. The values are also graphically illustrated in FIG. 4B.

These coefficients are suitable for realizing the 3 point filter being discussed. To obtain satisfactory results in the general case, the coefficients must be selected according to a specific critera. Each filter coefficient corresponds to a value of the desired function of time between an occurrence of an output digital data value within a output time domain and a time of occurrence of the input digital data value when mapped into the output domain such that each filter coefficient corresponds to a different output data value in a sequence of output data values.

The goal is to cause the filter gain to behave in a well controlled manner as a function of compression ratio. Because the gain of the filter is one point on the frequency response curve of the filter (e.g. response at zero frequency), it suffices to determine the frequency response as a function of compression ratio. This in turn is a function of the frequency response of the prototype filter from which the complete set of coefficients are derived.

Figure 4C:
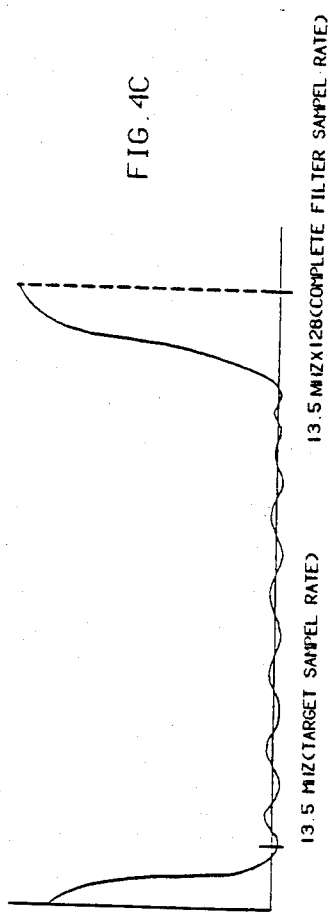
FIG. 4C is a graphical illustration of a typical filter frequency response.
Figure 4D:
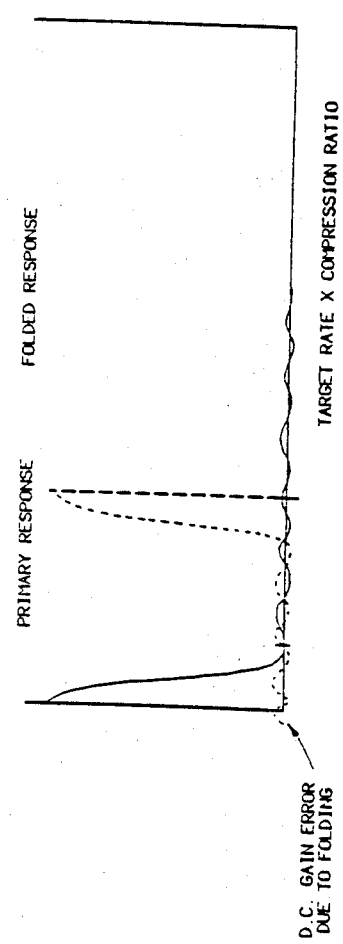
FIG. 4D is a graphical illustration of a typical filter frequency response with high frequency points folded back to perturb low frequency gain.

We define N1 as the number of target space points spanned by the filter and N2 as the total number of coefficients in the PROM. In the example, N1 =3 and N2=384. The complete set of coefficients describes a filter operating at N3=N2/N1 times the sample note of the target frame store. A typical frequency response is shown in FIG. 4C. However, the hardware operates to select only certain coefficients from this complete set of coefficients. For 1:1 compression, only N1 elements will be selected, and in general for a compression factor of F:1, approximately N1 F elements will be selected. The coefficients are in effect samples at a rate of N. F/N2. It is well known that the response of a filter derived in this way is subject to spectrum folding. As illustrated in FIG. 4D, the original response becomes repeated at multiples of the sample frequency, and the samples response ia the sum of the original response plus all the repetitions.

In particular, other points on the response curve will be folded back so as to perturb the zero frequency and low frequency filter gain.

In considering all possible compression ratios, and hence all filter sampling densities above N1 F/N2, any point on the prototype curve of FIG. 4C higher than the original target frame store sample rate will, at some compression ratio, fold back to zero frequency. Hence to prevent variations of gain other than those directly proportional to compression rate, the filter should be designed as if it were an N2 tap filter, operating at N2/N1 times the target frame store sample rate, with the smallest feasible side lobe amplitude above the target frame store sample rate consistent with a reasonable passband below one-half the target framestore sample rate.

There exist well known digital computer techniques for designing transversal filters with large numbers of

TABLE I

| 0  | 21 | 10 | 5  | 4  |
|----|----|----|----|----|
| 21 | 22 | 21 | 0  | 15 |
| 21 | 22 | 21 | 0  | 15 |
| 22 | b  | 22 | 21 | 10 |
| 22 | b  | 22 | 21 | 10 |
| b  | c  | b  | 22 | 21 |
| b  | c  | b  | 22 | 21 |
| c  | 15 | c  | b  | 22 |
| 1  | 0  | 21 | 10 | 5  |
| 2  | 21 | 22 | 21 | 0  |
| 2  | 21 | 22 | 21 | 0  |
| b  | 22 | b  | 22 | 21 |
| b  | 22 | b  | 22 | 21 |
| c  | b  | c  | b  | 22 |
| c  | b  | c  | b  | 22 |
| 15 | c  | 15 | c  | b  |
| 2  | 1  | 0  | 21 | 10 |
| b  | 2  | 21 | 22 | 21 |
| b  | 2  | 21 | 22 | 21 |
| c  | b  | 22 | b  | 22 |
| c  | b  | 22 | b  | 22 |
| 15 | c  | b  | c  | b  |
| 15 | c  | b  | c  | b  |
| 10 | 15 | c  | 15 | c  |
| 3  | 2  | 1  | 0  | 21 |
| 4  | b  | 2  | 21 | 22 |
| 4  | b  | 2  | 21 | 22 |
| 15 | c  | b  | 22 | b  |
| 15 | c  | b  | 22 | b  |
| 10 | 15 | c  | b  | c  |
| 10 | 15 | c  | b  | c  |
| 21 | 10 | 15 | c  | 15 |
| 4  | 3  | 2  | 1  |    |
| 15 | 4  | b  | 2  |    |
| 15 | 4  | b  | 2  |    |
| 10 | 15 | c  | b  |    |
| 10 | 15 | c  | b  |    |
| 21 | 10 | 15 | c  |    |
| 21 | 10 | 15 | c  |    |
| 22 | 21 | 10 | 15 |    |
| 5  | 4  | 3  | 2  |    |
| 0  | 15 | 4  | b  |    |
| 0  | 15 | 4  | b  |    |
| 21 | 10 | 15 | c  |    |
| 21 | 10 | 15 | c  |    |
| 22 | 21 | 10 | 15 |    |
| 22 | 21 | 10 | 15 |    |
| b  | 22 | 21 | 10 |    |
| 10 | 5  | 4  | 3  |    |
| 21 | 0  | 15 | 4  |    |
| 21 | 0  | 15 | 4  |    |
| 22 | 21 | 10 | 15 |    |
| b  | 22 | 21 | 10 |    |
| b  | 22 | 21 | 10 |    |
| c  | b  | 22 | 21 |    | taps according to criteria which include the above. A side lobe amplitude of −70 db has been found feasible and acceptable for the application disclosed.

TABLE II

| | | | | | | | | | |
|---|---|---|---|---|---|---|---|---|---|
| cc | 8f | 2d | 3 | 6 | 38 | 9d | 0 | 0 | 0 |
| cc | 8d | 2b | 3 | 6 | 3a | 9f | 0 | 0 | 0 |
| cb | 8b | 2a | 3 | 6 | 3b | a1 | 0 | 0 | 0 |
| cb | 89 | 29 | 3 | 7 | 3d | a2 | 0 | 0 | 0 |
| cb | 88 | 27 | 2 | 7 | 3e | a4 | 0 | 0 | 0 |
| cb | 86 | 26 | 2 | 8 | 40 | a6 | 0 | 0 | 0 |
| cb | 84 | 25 | 2 | 8 | 42 | a7 | 0 | 0 | 0 |
| ca | 82 | 24 | 2 | 9 | 43 | a9 | 0 | 0 | 0 |
| ca | 80 | 23 | 2 | 9 | 45 | aa | 0 | 0 | |
| ca | 7e | 22 | 2 | 9 | 46 | ac | 0 | 0 | |
| c9 | 7c | 20 | 1 | a | 48 | ad | 0 | 0 | |
| c9 | 7a | 1f | 1 | b | 4a | af | 0 | 0 | |
| c8 | 78 | 1e | 1 | b | 4c | b0 | 0 | 0 | |
| c8 | 76 | 1d | 1 | c | 4d | b2 | 0 | 0 | |
| c7 | 74 | 1c | 1 | c | 4f | b3 | 0 | 0 | |
| c6 | 72 | 1b | 1 | d | 51 | b4 | 0 | 0 | |
| c6 | 71 | 1a | 1 | d | 53 | b6 | 0 | 0 | |
| c5 | 6f | 19 | 1 | e | 54 | b7 | 0 | 0 | |
| c4 | 6d | 18 | 1 | f | 56 | b8 | 0 | 0 | |
| c4 | 6b | 17 | 0 | f | 58 | b9 | 0 | 0 | |
| c3 | 69 | 16 | 0 | 10 | 5a | bb | 0 | 0 | |
| c2 | 67 | 16 | 0 | 11 | 5c | bc | 0 | 0 | |
| c1 | 65 | 15 | 0 | 11 | 5e | bd | 0 | 0 | |
| c0 | 63 | 14 | 0 | 12 | 5f | be | 0 | 0 | |
| bf | 61 | 13 | 0 | 13 | 61 | bf | 0 | 0 | |
| be | 5f | 12 | 0 | 14 | 63 | c0 | 0 | 0 | |
| bd | 5e | 11 | 0 | 15 | 65 | c1 | 0 | 0 | |
| bc | 5c | 11 | 0 | 16 | 67 | c2 | 0 | 0 | |
| bb | 5a | 10 | 0 | 16 | 69 | c3 | 0 | 0 | |
| b9 | 58 | f | 0 | 17 | 6b | c4 | 0 | 0 | |
| b8 | 56 | f | 1 | 18 | 6d | c4 | 0 | 0 | |
| b7 | 54 | e | 1 | 19 | 6f | c5 | 0 | 0 | |
| b6 | 53 | d | 1 | 1a | 71 | c6 | 0 | 0 | |
| b4 | 51 | d | 1 | 1b | 72 | c6 | 0 | 0 | |
| b3 | 4f | c | 1 | 1c | 74 | c7 | 0 | 0 | |
| b2 | 4d | c | 1 | 1d | 76 | c8 | 0 | 0 | |
| b0 | 4c | b | 1 | 1e | 78 | c8 | 0 | 0 | |
| af | 4a | b | 1 | 1f | 7a | c9 | 0 | 0 | |
| ad | 48 | a | 1 | 20 | 7c | c9 | 0 | 0 | |
| ac | 46 | 9 | 2 | 22 | 7e | ca | 0 | 0 | |
| aa | 45 | 9 | 2 | 23 | 80 | ca | 0 | 0 | |
| a9 | 43 | 9 | 2 | 24 | 82 | ca | 0 | 0 | |
| a7 | 42 | 8 | 2 | 25 | 84 | cb | 0 | 0 | |
| a6 | 40 | 8 | 2 | 26 | 86 | cb | 0 | 0 | |
| a4 | 3e | 7 | 2 | 27 | 88 | cb | 0 | 0 | |
| a2 | 3d | 7 | 3 | 29 | 89 | cb | 0 | 0 | |
| a1 | 3b | 6 | 3 | 2a | 8b | cb | 0 | 0 | |
| 9f | 3a | 6 | 3 | 2b | 8d | cc | 0 | 0 | |
| 9d | 38 | 6 | 3 | 2d | 8f | 0 | 0 | 0 | |
| 9c | 37 | 5 | 4 | 2e | 91 | 0 | 0 | 0 | |
| 9a | 35 | 5 | 4 | 2f | 93 | 0 | 0 | 0 | |
| 98 | 34 | 5 | 4 | 31 | 94 | 0 | 0 | 0 | |
| 96 | 32 | 4 | 4 | 32 | 96 | 0 | 0 | 0 | |
| 94 | 31 | 4 | 5 | 34 | 98 | 0 | 0 | 0 | |
| 93 | 2f | 4 | 5 | 35 | 9a | 0 | 0 | 0 | |
| 91 | 2e | 4 | 5 | 37 | 9c | 0 | 0 | 0 | |

Line termination control circuitry 196 includes a line length register 198 which is initialized with a line length value indicating the number of pixels per horizontal line under control of address decode signals LDVLINIM, load vertical line length most significant byte and LDVLINL, load line length least signficant byte. The line length value is stored throughout the processing for a frame of data and is used to load a line length down counter 200 at the start of each line. Line length down counter 200 is decremented on the receipt of each successive byte of pixel data and until it is decremented to 0 to activate its terminal count output and generate signal *TPC, terminal pixel complete at the end of a horizontal line of input data. A modulo 4 counter 202 is preset to 0 at each line start along with the initialization of line length counter 200 and is enabled along with line length counter 200 in response to signal *VRA-MADEN, vertical RAM address enable, to generate at its Q1 output a signal VC, vertical component (L or C), which is utilized for output sequencing. The signal is also latched by a flip-flop 204 to generate at the Q output thereof a signal vertical output flip most significant bit, V0FMSB, which, as described earlier, controls the operation of ExclusiveOR gate 170.

The load controls for line length down counter 200 and modulo 4 counter 202 are generated by an OR gate 206 which receives as input signal *VRAMADEN, vertical RAM address enable, and the output of an AND gate 208 whose two inputs are driven by signal *TPC from the terminal count output of line length counter 200 and a Q output from a flip-flop 210 which is clocked by signal *VRAMADEN. Flip-flop 210 is selectively clear prior to frame start in response to signal *RST and has its D input connected to logic 1 so that it becomes set and remains set when signal VRAMADEN is generated at the end of the first line. The $\overline{Q}$ output of flip-flop 210 is communicated to one input of an OR gate 212 whose other input receives the *TPC signal from the terminal count output of line length counter 200. Signal *EOL, end of line is generated by the output of OR gate 212 with the $\overline{Q}$ output of flip-flop 210 inhibiting the generation of the active low state for this signal until after the completion of the first line.

It will thus be appreciated that the vertical filter 14 operates by receiving bytes of video pixel data in horizontal raster scan order As the first byte of data is received it is sequentially multiplied by three sequentially phased filter coefficient values with the partial products being stored in a first location of each of the three line buffers 154, 155 and 156 respectively. The actual address is defined by the output of line length counter 200. As the second byte is received, it is similarly sequentially multiplied by the three filter coefficient values with the resulting three coefficient products being stored in a second location of the three line buffers 154, 155 and 156 respectively. In similar manner, each of the pixel bytes for the first line of source video data is multiplied by the three filter coefficient values with the resulting product being stored in a different memory location within the corresponding line buffer 154, 155 or 156. At the end of the first line, each of the line buffers 154-156 stores a partial product value for each pixel in the line. As the second line of data is received, each pixel value is again sequentially multiplied by the corresponding filter coefficient value which has now been changed to reflect the advancement to the next line and the coefficient product is added to the corresponding coefficient product for the preceding line. This process continues until one of the who done V signals WHODONEV2-0 indicates that processing is complete for one of the filter processors. At this point as the next line of input video data is received, the corresponding coefficient filter products for the filter which is done are added to 0 and the accumulated coefficient products stored in the corresponding one of the line buffer 154-156 are output to either the output FIFO 17 (to frame store) or to the horizontal filter in the case of the normal operating mode. The coefficient products for the other filter processor which are not done continue to be accumulated. This process is repeated for each pixel data value in the source image scan line. The vertical filter 14 thus operates irrespective of the compression ratio to provide a three point filter in target image space which corresponds to a number of points in the source image space which depends upon the compression ratio. The effective size of the filter window in source image space is thus increased with the compression ratio without changing the system hardware by accumulating more and more coefficient products as the compression ratio increases. Because the phase increment value is made smaller, more steps are required before the pixel phase address value is incremented beyond a window boundary.

The horizontal control circuitry for the horizontal filter 16 is illustrated in FIGS. 5A–5G. While there are some differences between the horizontal and the vertical control circuitry to account for the different directions in which the filters extend and the fact that the data raster scan order is parallel to the horizontal filter direction and perpendicular to the vertical filter direction, the circuitry is similar.

Figure 5A:
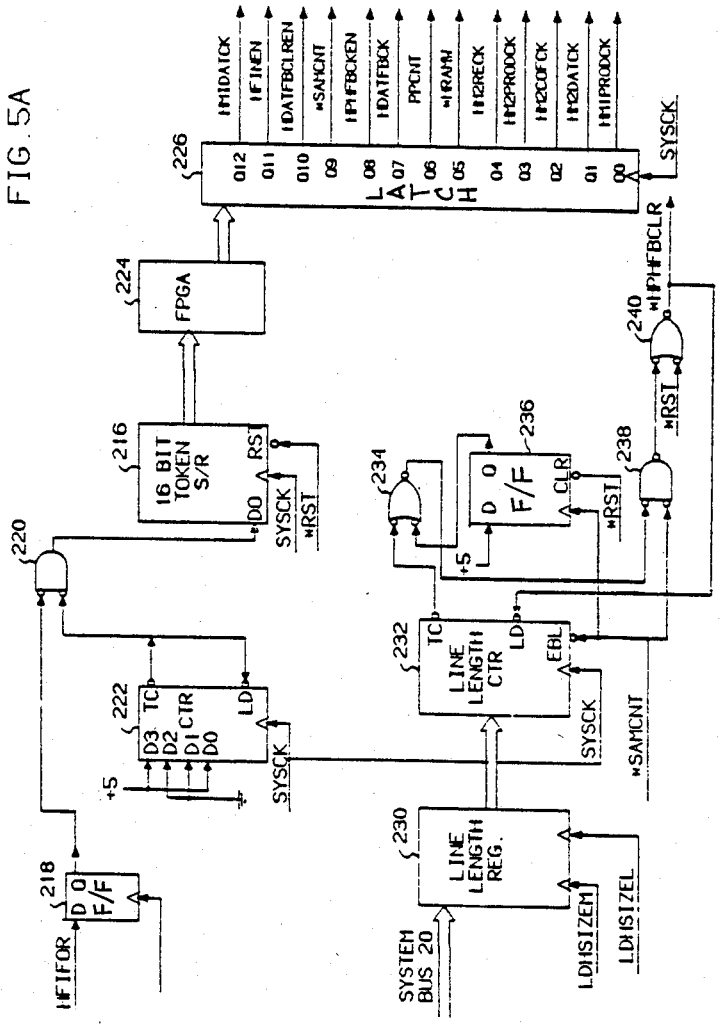

Referring now to FIG. 5A a token shift register 216 provides master timing control in a manner similar to that provided for the vertical control circuitry. A flip-flop 218 is clocked by signal system clock and has its D input connected to signal HIFOR, horizontal FIFO ready. The Q output of flip-flop 218 is connected to one input of a NOR gate 220 which has its other input connected to the terminal count output of a recycling modulo 7 counter 222. Counter 222 enables the horizontal FIFO ready signal latched by flip-flop 218 to be sampled every seven counts of the system clock signal andn when present, to be communicated to the D0 input of 16 bit token shift register 216 which is clocked by the system clock signal. A field programmable gate array 224 has 16 inputs thereof connected to the 16 outputs of token shift register 216 and in response thereto generates 13 horizontal master timing signals which are communicated to a holding latch 226. As with the vertical control circuit, the output of holding latch 226 defines time cell 0 with the 12 outputs Q11-Q0 providing master timing and control for the horizontal filter 16.

The Q0 output of latch 226 generates a signal HM1PRODCK, horizontal multiplier 1 product clock at time cell 2 which operates to load the calculated prescale value to an output latch for a prescale multiplier.

Output Q1 generates signal HM2DATCK, horizontal multiplier 2 data clock, at time cell 3 which operates to load the calculated prescale value into an input latch for a coefficient multiplier which is designated multiplier 2.

The Q2 output of latch 226 generates signal HM2COFCK, horizontal multiplier 2 coefficient clock, which at time cell 3, 5 and 7 loads the three filter coefficient values successively to the coefficient multiplier input.

The Q3 output of latch 226 generates a signal HM2PRODCK, horizontal multiplier 2 product clock, which causes the output latch of the coefficient multiplier to successively latch and hold the three calculated coefficient products corresponding to the three filter processors at time cells 5, 7 and 9, which allow a two cell calculation time, for each of the three coefficient products.

The Q4 output of latch 226 generates signal HM2RECK, horizontal multiplier 2 result clock at time cells 6, 8 and A to load the calculated product coefficient into a holding latch.

The Q5 output of latch 226 generates a signal *HRAMW, horizontal RAM write, which controls the read/write mode of the horizontal accumulating partial coefficient product memory to either read out previously accumulated data or to store a new set of data.

Signal *HRAMW goes active low during time cells 7, 9 and B.

The Q6 output latch 226 generates a signal PPCNT, partial product count at time cells 2, 4 and 6 which sequences a modulo 3 counter to index the three filter processors for the horizontal filter.

The Q7 output generates signal HDATFBCK, horizontal data feedback clock, at time cells 6, 8 and A to control the adding of accumulated coefficient products to a next coefficient product.

The Q8 output generates signal HPHFBCKEN, horizontal phase feedback clock enable, at time cell T0 to control the sequencing of the horizontal phase counter.

Output Q9 generates signal *SAMCNT, sample count, which becomes active low at time cell 1 to control the incrementing of a modulo 4 counter which keeps track of the repetitive four pixel sequence consisting of luminance, chrominance, chrominance and luminance data.

The Q10 output generates signal HDATFBCLREN, horizontal data feedback clear enable at time cell 6 to enable the outputting of 0 data as opposed to accumulated coefficient product values to begin the processing for a new target pixel data point.

The Q11 output generates signal HFINEN, horizontal finish enable at time cell 6 to enable the outputting of horizontal filter data.

The Q12 output of latch 226 generates signal HM1DATCK, horizontal multiplier 1 data clock, at time cell 0 which commands the loading of a next pixel video data byte into the prescale multiplier of horizontal filter 16. It will be noted that for the most part these master control signals correspond in type and timing to similar control signals for the vertical filter 14.

A line length register 230 is initialized with data from system bus 20 in response to address decode signals LDHSIZEM, load horizontal size most significant byte, and LDHSIZEL, load horizontal size least significant byte. At the start of each line a line length down counter 232 is loaded with the line length value from register 230 and decremented upon receipt of each pixel of input data in response to clock signal SYSCK and an enable signal *SAMCNT at time cell 1. The terminal count output of line length counter 232 is connected to one input of an AND gate 234 having its other input connected to the Q output of a flip-flop 236. Flip-flop 236 is reset by signal *RST during initialization for a frame of data and remains reset until clocked by signals RSAMCNT at the end of time cell 1 for the first byte of pixel data. The output of AND gate 234 is connected to an OR gate 238 to communicate the terminal count signal from line counter 232 after the first pixel for a given line has been processed. The other input to OR gate 238 is coupled to signal *SAMCNT. The output of OR gate 238 is connected to one input of AND gate 240 which also receives signal *RST and generates at its output signal *HPHFBCLR, horizontal phase feedback clear, which is connected (among other things) to the load input of line length counter 232 to cause this counter to be reloaded at the start of each line.

Figure 5B:
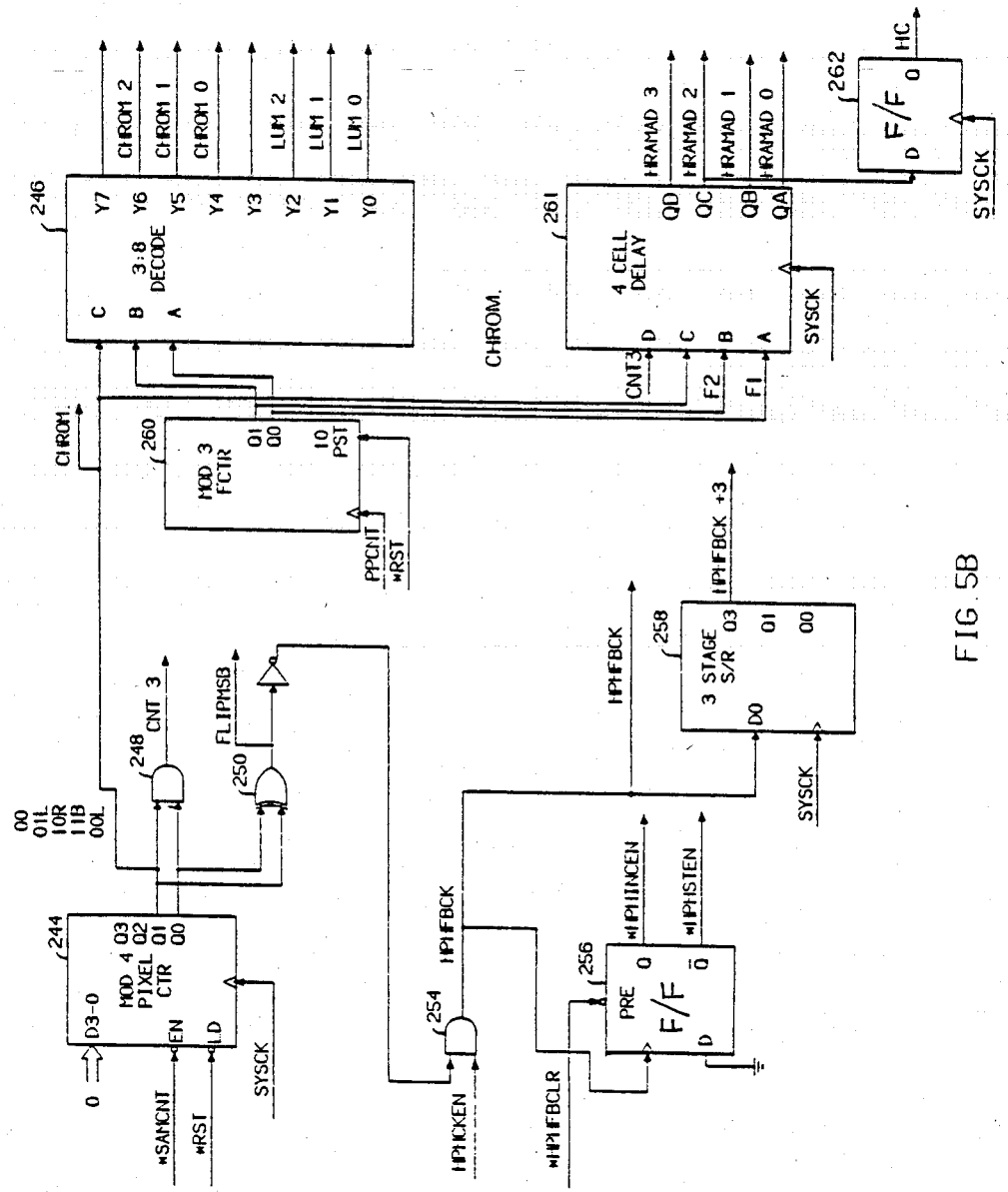

FIG. 5B illustrates the control circuitry for distinguishing between the luminance and chrominance data and for controlling the sequencing for the three sequential filter processors which are operated simultaneously with equally displaced phasing. A modulo 4 pixel counter 244 has its data inputs connected to logic 0 and its clock input connected to the system clock signal. The load input is connected to the reset signal *RST while the count enable input is connected to the sample count signal *SAMCNT. Counter 244 is thus incremented at time cell 1 for each pixel of input video data. Because pixel counter 244 is incremented at the beginning of each pixel processing cycle, a count of 1 in effect corresponds to luminance data, a count of 2 corresponds to red-Y chrominance data, a count of 3 corresponds to blue-Y chrominance data, and a recycled count of 0 corresponds to the even numbered byte of luminance data for which there is no corresponding chrominance data. It will thus be seen that the Q1 output indicates that chrominance data is being processed. This signal is designated CROM. and is communicated to the most significant input of a 3:8 decoder 246. The Q1 output of counter 244 is also communicated to an AND gate 248 whose second input is connected to the Q0 output of counter 244. AND gate 248 thus decodes a count of 3 corresponding to blue chrominance data. An exclusive OR gate 250 has its input connected to the Q1 and Q0 outputs of counter 244. Exclusive OR gate 250 generates a signal FLIPMSB, flip most significant bit which causes the sign bit to be inverted before it is output from the horizontal filter 16. This signal is delayed by one input pixel time prior to use so that by the time it is used to control the complementing of a most significant bit or sign bit of data, it is properly aligned with chrominance data. Signal FLIPMSB is also complemented by an inverter gate 252 and communicated to an AND gate 254. A second input of AND gate 254 is connected to signal HPHCKEN, horizontal phase clock enable with the output generating signal HPHFBCK, horizontal phase feedback clock. The output of AND gate 254 is connected to the clock input of a latch 256 which generates at its Q output signal HPHINCEN, horizontal phase increment enable and at its $\overline{Q}$ output signal *HPHSTEN, horizontal phase start enable. These signals control whether a start value or an increment value is used to control a horizontal position phase counter in the horizontal filter data path. Latch 256 is coupled to preset in response to signal *HPHFBCLR, horizontal phase feedback clear.

The HPHFBCK output of AND gate 254 is also communicated to a D0 input of a three stage shift register connected latch 258. Shift register 258 is clocked by the system clock signal and at the Q3 output thereof generates a signal HPHFBCK+3 which represents signal HPHFBCK delayed by three time cells. This delayed signal is used to clock the who done holding latches which correspond to similar latches in the vertical control circuit. A modulo 3 filter counter 260 is coupled to be preset to state 1, 0 in response to signal *RST and is clocked under control of signal PPCNT. The Q0 and Q1 outputs indicate which filter processor is active and are communicated to decoder 246. Decoder output Y0-Y2 thus indicate active states for luminance filters 0, 1 and 2 respectively while the outputs Y4-Y6 indicate active states for chrominance filters 0, 1 and 2 respectively. The Q0 and Q1 outputs of counter 260 are also communicated to the A and B inputs of a four cell delay circuit 261 which generates corresponding outputs HRAMAD0, horizontal RAM address 0, and HRMAMAD1, horizontal RAM address 1 four time cells later. The C and D inputs to four cell delay circuit 261 are coupled to the chrominance signal and the count 3 signal respectively. After a delay of four time cells the QC and QD outputs of delay circuit 261 generate corresponding signals HRMAD2, horizontal RAM address 2 and HRMAD3, horizontal RAM address 3. Signal HRMAD2 is coupled to the D input of a holding latch 262 which generates the horizontal control signal HC at the Q output thereof. Latch 262 is clocked by signal system clock.

Referring now to FIG. 5C, a system bus address decoder 270 receives the system bus address signals and decodes these signals to generate the control signals for loading system bus 20 data into the holding latches during preframe initialization. Note that signal *RST is generated as a decoded address signal. It is immaterial which precise address code is assigned to which signal and this decoding function is therefore not described in detail.

The load path select signal, LDPATHSEL, is coupled to the clock input of a path select register 272 which loads a byte of system bus data defining the manner in which video data will pass through the filters 14, 16. Note that output Q6 generates signal *OUTEN, which is a general system output enable signal while output Q3 generates signal *HDISKINEN, and output Q2 generates signal *HTOOUT. It will be recalled that these mode control signals control which of the filters 14, 16 operate to process video data. Bits Q5 and Q4 from register 72 are connected to the A and B inputs of a vertical decoder 264 which generates corresponding output control signals *VPOSTEN3-0, vertical post enable 3-0. These signals define the number of bit positions for which shifting occurs in the vertical postscale shifter 40.

Similarly, a decoder 266 responds to the Q0 and Q1 outputs of register 272 to define the number of bits by which the horizontal filter data is to be shifted by a postscale shifter similar to that in the vertical data path. The outputs are designated HPOSTEN3-0. The Q2 output of register 272 generates a signal *HTOOUT which is complemented by an inverter gate 268 for use elsewhere in the system.

Referring now to FIG. 5D, the horizontal who done luminance signals designated WHODONEL2-0 are communicated to three OR gates 275, 276 and 277. Each of these gates receives as a second input signal *HPHINCEN and the outputs are coupled respectively to the D5-D3 inputs of a holding latch 280. Similarly, the WHODONEL2-0 signals are coupled directly to the D2-D0 inputs of holding latch 280. Holding latch 280 is clocked by signal HPHFB+3 and the output is enabled in response to an active low chrominance signal.

Similarly, three who done chrominance signals WHODONEC2-0 are coupled to three OR gates 283, 284 and 285. A second input of each of these OR gates is coupled to signal *HPHINCEN. The output of the three OR gates 283-285 are coupled respectively to the D5-D3 inputs of a holding latch 288. Inputs D2-D0 of latch 288 receives the three who done chrominance signals directly. The six outputs Q5-Q0 of latch 288 are communicated to six OR gates 287-292, respectively. In order to provide proper timing, OR gates 287-289 receive the outputs of OR gates 283-285 directly as well as through latch 288 with a one luminance sample time delay while OR gates 290-292 receive the who done chrominance signals directly as well as through latch 288 with a one luminance sample time delay. The outputs of OR gates 287-292 are connected to the D5-D0 inputs of a chrominance holding latch 294 which is clocked by signal HPHFB+3 at the same time as holding latch 280 for luminance data. The output of latch 294 is enabled by the active high state of signal CHROM. The state of signal CHROM thus alternately selects either luminance latch 280 or chrominance latch 294 for outputting to a horizontal enable data feedback synchronization circuit 296 or a horizontal post clock synchronization circuit 298. These synchronization circuits provide time cell delays of 1, 3 or 5 time cells corresponding to filters 0, 1 and 2 before generating respectively signal *HENDATFB, horizontal enable data feedback and HPOSTCK, horizontal post clock. These circuits are analogous and work in a manner similar to the vertical control circuit shown in FIG. 2.

Figures 5E, 5G:
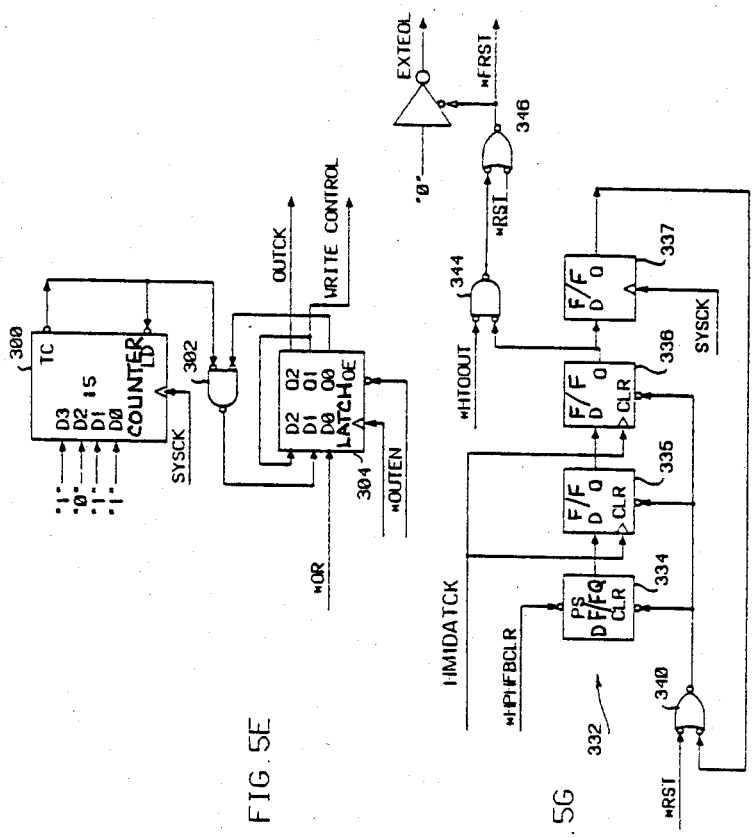

Referring to FIG. 5E, a modulo 5 counter responds to clock signal SYSCK and is coupled to repeatedly count from 11 to 15. The terminal count output is connected to one input of an OR gate 302. Signal *OR, output ready from the horizontal filter output FIFO circuit, is coupled to the D0 input of a latch 304 whose clock input is coupled to signal SYSCK. The Q0 output of latch 304 is coupled to the second input of OR gate 302 whose output is connected to the D1 input of latch 304 to in turn generate at the Q1 output thereof signal Write Control. This Q1 output is delayed by one cell time by coupling to the D2 input of latch 304 which generates at the Q2 output thereof signal OUTCK, output clock. The output of latch 304 is enabled in response to signals *OUTEN, output enable. These signals control the timing for the outputting of filtered data to an external device.

Figure 5F:
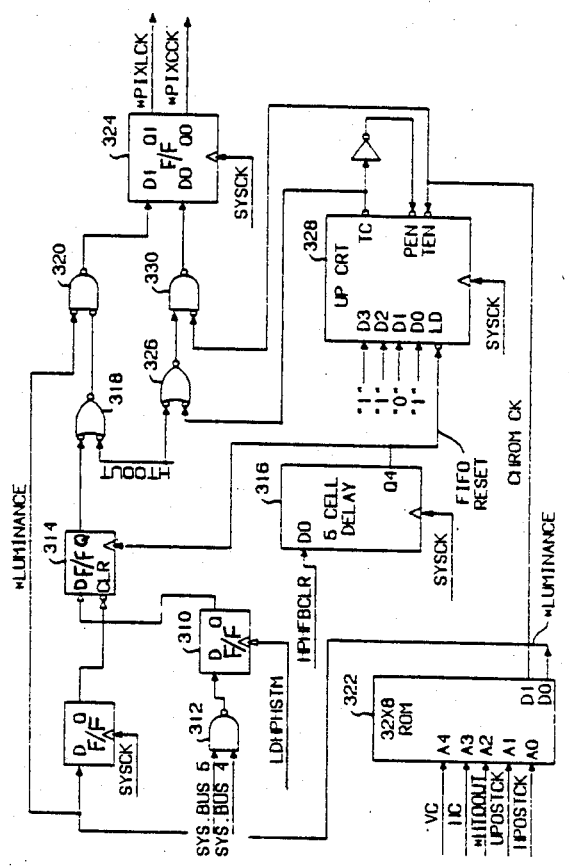

FIG. 5F illustrates control circuitry for generating luminance and chrominance pixel clock signals for loading the pixel data into the output FIFOs with a first pixel which is defined by one luminance byte and two chrominance byes, and which contains incomplete data, being selectively ignored. A latch 310 is clocked under control of system bus address decode signal LDHPHSTM, load horizontal phase start most significant byte to load the output of a NAND gate 312 in response thereto. NAND gate 312 receives two input bits 5 and 4 from system bus 20. If these bits are both true, the output of NAND gate 312 goes low to command the ignoring of 0 output data pixels. If either bit 5 or bit 4 is at logic 0, the output of NAND gate 312 goes high to command that the first output pixel be ignored. The output of latch 310 which is held for a full frame, is communicated to the D input of a line holding flip-flop 314 which is clocked by the Q4 output of a five time cell delay circuit 316. The Q output of latch 314 is connected as one input to an AND gate 318 with the second input being driven by signal HTOOUT. The output of AND gate 318 is connected as one input to an OR gate 320 whose second input is connected to a signal *LUMINANCE which indicates the luminance data. This signal is generated by the data 0 output of a 32×8 control ROM 322. Control ROM 322 receives as address input signals HPOSTCK, VPOSTCK, *HTOOUT, HC, and VC. The D1 output generates a signal CHROM CK, chrominance clock, and the data contents of ROM 322 are shown in Table III.

TABLE III

| |
|---|
| ff |
| fe |
| ff |
| fe |
| ff |
| ff |
| fe |
| fe |
| ff |
| fd |

TABLE III-continued

| |
|---|
| ff |
| fd |
| ff |
| ff |
| fe |
| fe |
| ff |
| fe |
| ff |
| fe |
| ff |
| ff |
| fd |
| fd |
| ff |
| fd |
| ff |
| fd |
| ff |
| ff |
| fd |
| fd |

The output of OR gate 320 is connected to the D1 input of a latch 324 which generates at its Q1 output signal *PIXLCK, pixel luminance clock, under control of latch clock signal SYSCK. Signal *PIXLCK may be selectively delayed at the start of each line under control of the system bus bits 5, 4 (when bits 5, 4=1, 1) to cause the incomplete output data for the first two chrominance bytes to be ignored. An AND gate 326 receives as a first input signal HTOOUT and as a second input the terminal count output of an up counter 328 which is loaded with a count of 13 in response to the Q4 output of five cell delay circuit 316 and then counts up for two counts to terminal count at which time further counting is disabled. A second count enable input to counter 328 is connected to the D1 output of ROM 322 which produces the signal CHROM CK, Chrominance clock. The output of AND gate 326 is connected as one input to an OR gate 330 whose second input is coupled to the chrominance clock signa, CHROM CK. The output of OR gate 330 is connected to the D0 input of latch 324 which produces at its Q0 output the signal *PIXCCK, pixel chrominance clock, which is used to clock the input to the chrominance output FIFO.

FIG. 5G illustrates an end-of-line signal generating circuit 332 which generates the external end-of-line signal, EXTEOL which is used to control the external frame store memory 18. The purpose of signal EXTEOL is to cause the frame store address to increment by one line in Y and reset X to start of line. A FIFO reset signal, *FRST is generated to reset the horizontal filter output FIFO stacks at the end of every line. Signal *FRST is delayed at the end of each line for a time period that is sufficient to allow a last byte of valid data to be passed through output FIFO 17 to frame store 18. The end-of-line control circuitry 332 includes four sequentially connected D latches 334–337. Latches 334, 335 and 336 have inverting clear inputs connected to the output of an AND gate 340. AND gate 340 has one input responsive to the master reset signal, *RST and the second input responsive to the Q output of latch 337. Latch 337 is clocked by signal SYSK while latches 335, 336 are clocked by signal HM1DATCK. Thus, upon the occurrence of signal *HPHFBCLR, horizontal phase feedback clear, at the end of a line, latch 334 is preset and after a delay of two byte processing times latch 336 is set to enable OR gate 344 with its $\overline{Q}$ output and cause latch 337 to go to a state of 0 one clock time later. This 0 state is communicated through AND gate 340 to in turn reset the latch 334 until the end of the next line. However, before the circuit 332 is reset, the $\overline{Q}$ output of latch 336 is communicated through OR gate 344 to an AND gate 346 to generate signal *FRST and enable an inverting buffer having its input connected to 0 to generate signal EXTEOL. A second input of AND gate 346 is connected to the system reset signal *RST to provide external end-of-line resets and a FIFO reset. Circuit 332 is intended to delay the FIFO reset signal FRST as long as possible at the end of each line to enable all valid data to be read therefrom before the end of line FIFO reset occurs.

Figure 6A:
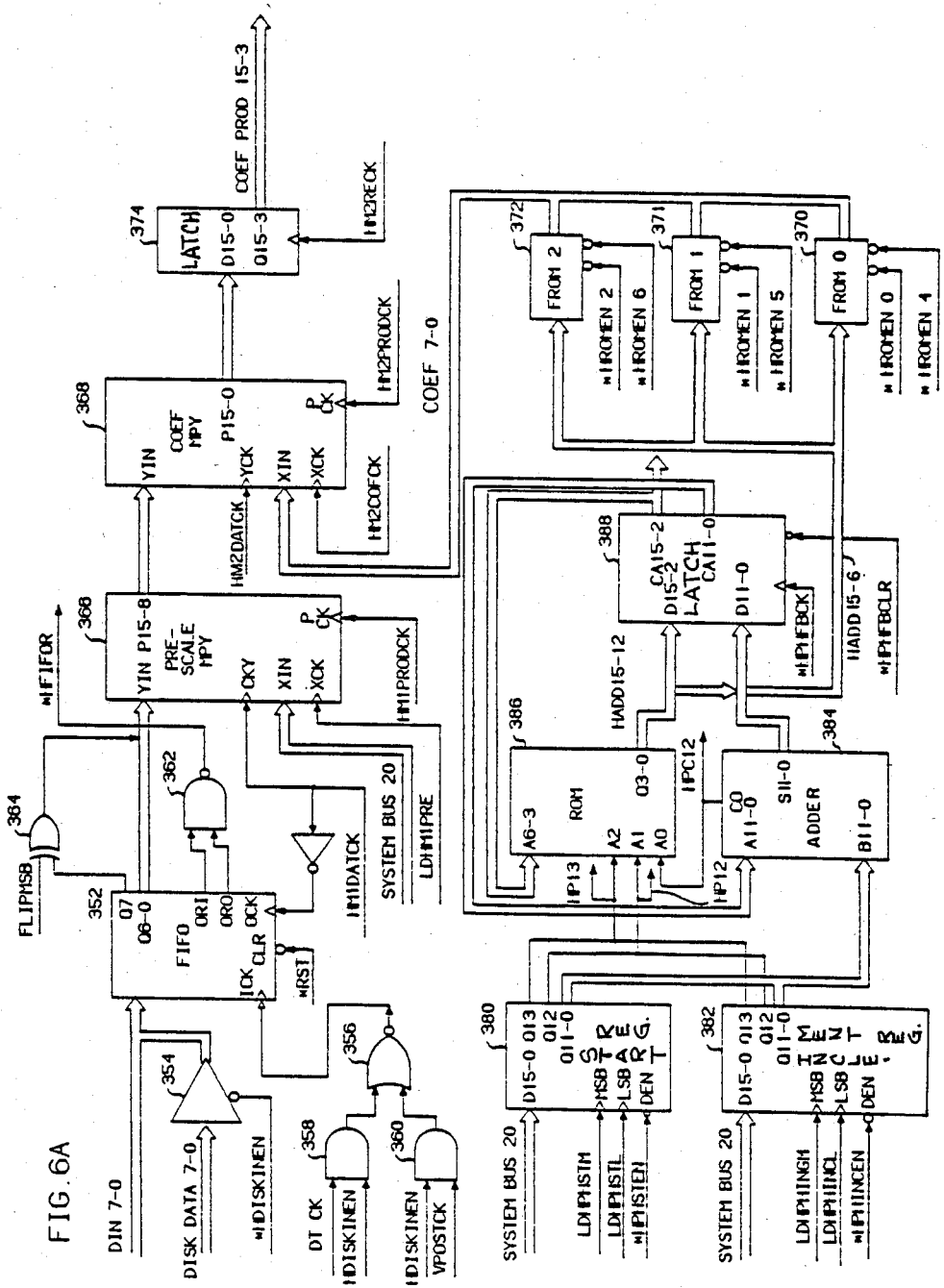
FIGS. 6A and 6B are block diagram and schematic diagram representations of a data path for a horizontal filter shown in FIG. 1.
Figure 6B:
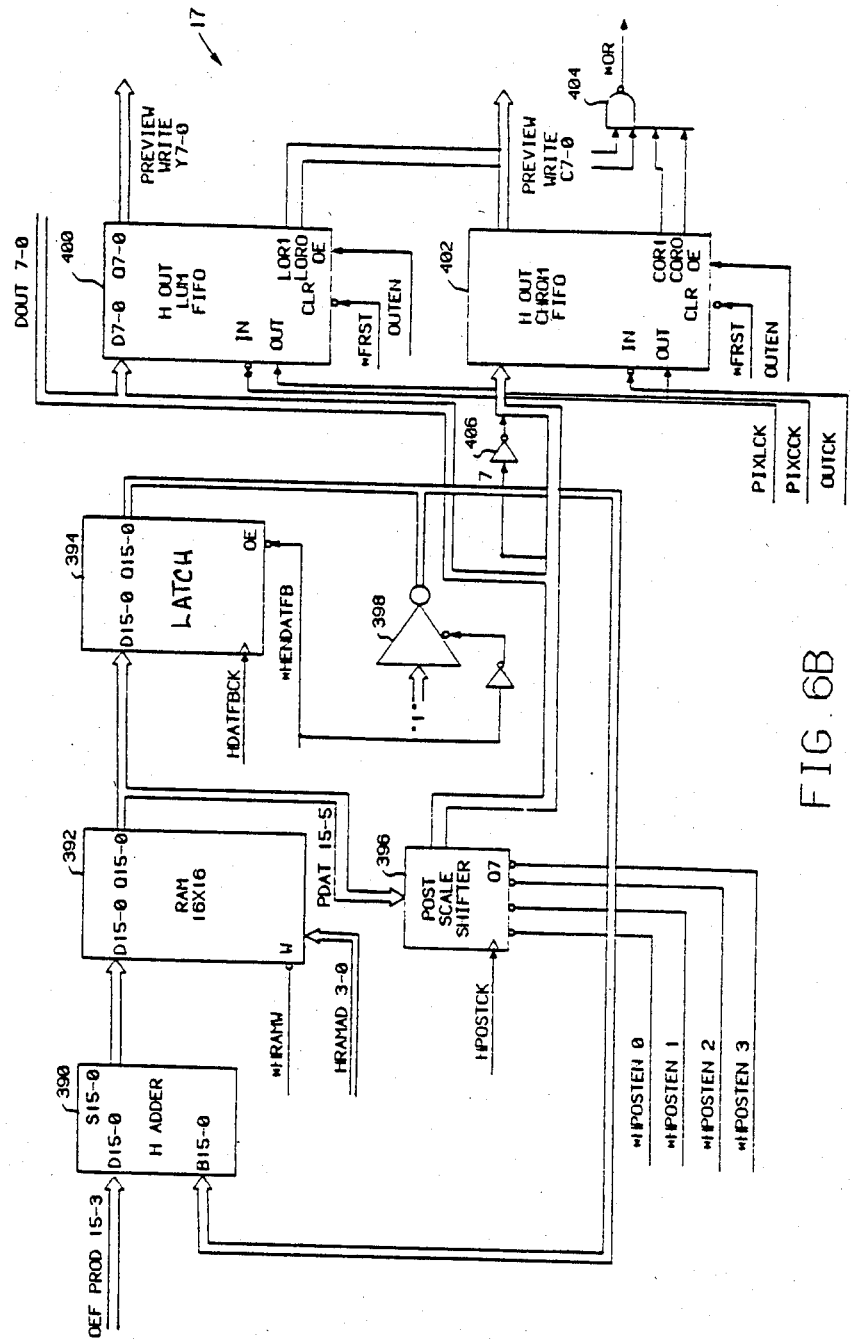

The horizontal data path 350 is shown in FIG. 6A and 6B to which reference is now made. The horizontal data path is similar in timing and operatron in many respects to the vertical data path and the detailed timing diagram shown in FIG. 4A for the vertical data path will therefore not be repeated for the horizontal data path. In general, the pipelining of three sequential filter processors, one for each filter in the target image domain is essentially the same. Detailed differences of implementation result from the direction of the filter and the need to distinguish between luminance data and the two kinds of chrominance data with the different spatial resolution assigned thereto.

A horizontal FIFO stack circuit 352 receives input video pixel data either from the vertical processor 14 on a bus designated DIN7-0 or from input pixel data source such as source 12 on a bus designated DISK DATA 7-0. A signal *HDISKINEN, horizontal disk input enable selectively enables the output of a buffer 354 to enable the presentation of data directly from a disk data source. The input clock, ICK of FIFO 352 is connected to the output of a NOR gate 356 having a first input connected to an AND gate 358 and a second input connected to the output of an AND gate 360. AND gate 358 is coupled to pass an external data clock signal, DT CK when enabled by signal HDISKINEN, horizontal disk input enable and AND gate 360 is coupled to pass the vertical filter output clock signal VPOSTCK when enabled by signal *HDISKINEN. FIFO 352 is reset during initialization by signal *RST and has the output clock OCK control thereof coupled to receive the complement of signal HM1DATCK, horizontal multiplier 1 data clock.

As with the vertical filter system, the FIFO 352 is implemented with two parts with the two output ready signals coupled to a NAND gate 362 which generates a signal *HFIFOR, horizontal FIFO ready when both of the sections contain pixel data. An Exclusive-OR gate 364 selectively inverts the most significant bit of chrominance data in response to signal FLIPMSB, flip most significant bit for reasons previously explained. The output of FIFO 352 is connected to a Y input of a first or prescale multiply circuit 366 in response to Y input clock signal HM1DATCK. The X input of prescale multiply circuit 366 is coupled to receive and load the prescale multiplier value from system bus 20 in response to the address decode signal LDHM1PRE, load horizontal multiplier 1 prescaler. The calculated product is stored in an output latch in response to a product clock signal HM1PRODCK, horizontal multiplier 1 product clock. The latched output of multiplier 366 is communicated to a Y input of coefficient multiplier 368 under control of clock signal HM2DATCK, horizontal multiplier 2 data clock. The X input multiplier 368 receives sequentially three filter coefficient values from filter ROMs 0, 1 and 2 370-372 under control of the clock signal HM2COFCK, horizontal multiplier 2 coefficient clock. Two cell times after each of the three coefficient clock signals the output is latched in response to signal HM2PRODCK, horizontal multiplier 2 to product clock. A latch 374 receives and latches the 13 most significant output bits from coefficient multiplier 368 in response to clock signal HM2RECK, horizontal multiplier 2 result clock, which trails product clock by one cell time.

The phase control circuitry 378 for horizontal filter 16 is similar to that of vertical filter 14. A start latch 380 receives from system bus 20 two bytes of starting location data in response to decoded address signals LDHPHSTM, load phase start most significant byte, and LDHPHSTL, load phase start least significant byte. The output of latch 380 is enabled in response to signal *HPHSTEN, horizontal phase start enable. An increment latch 382 receives over system bus 20 at initialization time two bytes defining the increment for each horizontal pixel which is essentially the reciprocal of the compression ratio. This value is stored in response to the decoded address signal LDHPHINCM, load horizontal phase increment most significant byte and LDHPHINCL, load horizontal phase increment least significant byte. The output of latch 382 is enabled in response to signal *HPHINCEN, horizontal phase increment enable. Thus, as with the horizontal filter, the start register 380 provides a relative start address for each line and the increment register 382 provides an increment value which is thereafter added to the start value upon each occurrence of a byte of luminance data.

A combination adder 384 and read only memory 386 are connected to accumulate previous address or phase values plus each new increment with the result being stored in an address latch 388. Address latch 388 is loaded during time cell 0 under control of signal HPHFBCK (FIG. 5B) and is cleared at the start of each line by signal *HPHPBCLR. The accumulated output of adder 384 and ROM 386 are also communicated as address inputs to the three sections of the coefficient filter ROMs 0, 1 and 2. It will be noted that ROM 370 is enabled in response to the signals *HROMEN0 and HROMEN4 under control of a most significant address bit. Similarly, filter ROM1 371 is enabled in response to signals *HROMEN1 and 5 which are delayed two cell times relative to the ROM0 enable signals and filter ROM2 372 is enabled in response to signal *HROMEN2 and 6 which are respectively delayed two cell times relative to the filter ROM1 enable signals.

The horizontal filter coefficient ROMs 370-372 each store coefficient values for two filter coefficient curves. One curve for luminance data which is identical to the vertical coefficient curve set forth in Table II and a separate curve for chrominance data as set forth in Table IV. A separate curve is required for chrominance horizontal coefficients because chrominance data has only half the spatial resolution of luminance data in the horizontal direction. Signals *HROMEN0-2 enable sections of filter ROMs 370-372 storing luminance filter coefficients while signals *HROMEN4-6 enable sections of filter ROMs 370-372 storing chrominance filter coefficients.

Table IV defines the chrominance coefficient data for FROM0 370. As with the luminance data, the coefficient functions for filters 1 and 2 are the same except that they are each phase shifted successively by 1 pixel position (128 address counts) to the right. (Ignoring addresses not accessed by the modulo 3 counting scheme).

Actually, the horizontal L and C curves are the same. The chroma filters are effectively twice as wide as the luminance filters, but in the PROMs we compensate for this by indexing through the chroma "twice as fast". That is, the chroma PROMs "see" a phase address left-shifted one place with respect to that "seen" by the luminance PROMs. The difference in PROM contents is then entirely due to discontinuities in the modulo 3 address (phase) space which occur in a different way for a shifted address.

image space. Bit 15 counts overflows from bits 14, 13 on a modulo 2 basis.

Address bits 14-6 couple to address inputs 8-0 of the sections of ROMs 370-273 storing luminance data in a manner paralleling ROMs 192-194 for vertical filter 14. However, because chrominance data has only half the resolution of luminance data, and in order to attain the same filtering resolution, the address inputs 8-0 for the chrominance sections of filter ROMs 370-372 are coupled respectively to addresses 15-7. That is, the connections are shifted by one bit position relative to the luminance connections. The contents of horizontal phase ROM 386 are set forth in Table V.

TABLE IV

| | | | | | | | | |
|---|---|---|---|---|---|---|---|---|
| cc | 8f | 2d | 3 | 0 | 3 | 2d | 8f | 0 | 0 |
| cc | 8d | 2b | 3 | 0 | 4 | 2e | 91 | 0 | 0 |
| cb | 8b | 2a | 3 | 0 | 4 | 2f | 93 | 0 | 0 |
| cb | 89 | 29 | 3 | 0 | 4 | 31 | 94 | 0 | 0 |
| cb | 88 | 27 | 2 | 0 | 4 | 32 | 96 | 0 | 0 |
| cb | 86 | 26 | 2 | 0 | 5 | 34 | 98 | 0 | 0 |
| cb | 84 | 25 | 2 | 0 | 5 | 35 | 9a | 0 | 0 |
| ca | 82 | 24 | 2 | 0 | 5 | 37 | 9c | 0 | 0 |
| ca | 80 | 23 | 2 | 0 | 6 | 38 | 9d | 0 | |
| ca | 7e | 22 | 2 | 0 | 6 | 3a | 9f | 0 | |
| c9 | 7c | 20 | 1 | 0 | 6 | 3b | a1 | 0 | |
| c9 | 7a | 1f | 1 | 0 | 7 | 3d | a2 | 0 | |
| c8 | 78 | 1e | 1 | 0 | 7 | 3e | a4 | 0 | |
| c8 | 76 | 1d | 1 | 0 | 8 | 40 | a6 | 0 | |
| c7 | 74 | 1c | 1 | 0 | 8 | 42 | a7 | 0 | |
| c6 | 72 | 1b | 1 | 0 | 9 | 43 | a9 | 0 | |
| c6 | 71 | 1a | 1 | 0 | 9 | 45 | aa | 0 | |
| c5 | 6f | 19 | 1 | 0 | 9 | 46 | ac | 0 | |
| c4 | 6d | 18 | 1 | 0 | a | 48 | ad | 0 | |
| c4 | 6b | 17 | 0 | 0 | b | 4a | af | 0 | |
| c3 | 69 | 16 | 0 | 0 | b | 4c | b0 | 0 | |
| c2 | 67 | 16 | 0 | 0 | c | 4d | b2 | 0 | |
| c1 | 65 | 15 | 0 | 0 | c | 4f | b3 | 0 | |
| c0 | 63 | 14 | 0 | 0 | d | 51 | b4 | 0 | |
| bf | 61 | 13 | 0 | 0 | d | 53 | b6 | 0 | |
| be | 5f | 12 | 0 | 0 | e | 54 | b7 | 0 | |
| bd | 5e | 11 | 0 | 0 | f | 56 | b8 | 0 | |
| bc | 5c | 11 | 0 | 0 | f | 58 | b9 | 0 | |
| bb | 5a | 10 | 0 | 0 | 10 | 5a | bb | 0 | |
| b9 | 58 | f | 0 | 0 | 11 | 5c | bc | 0 | |
| b8 | 56 | f | 0 | 0 | 11 | 5e | bd | 0 | |
| b7 | 54 | e | 0 | 0 | 12 | 5f | be | 0 | |
| b6 | 53 | d | 0 | 0 | 13 | 61 | bf | 0 | |
| b4 | 51 | d | 0 | 0 | 14 | 63 | c0 | 0 | |
| b3 | 4f | c | 0 | 0 | 15 | 65 | c1 | 0 | |
| b2 | 4d | c | 0 | 0 | 16 | 67 | c2 | 0 | |
| b0 | 4c | b | 0 | 0 | 16 | 69 | c3 | 0 | |
| af | 4a | b | 0 | 0 | 17 | 6b | c4 | 0 | |
| ad | 48 | a | 0 | 1 | 18 | 6d | c4 | 0 | |
| ac | 46 | 9 | 0 | 1 | 19 | 6f | c5 | 0 | |
| aa | 45 | 9 | 0 | 1 | 1a | 71 | c6 | 0 | |
| a9 | 43 | 9 | 0 | 1 | 1b | 72 | c6 | 0 | |
| a7 | 42 | 8 | 0 | 1 | 1c | 74 | c7 | 0 | |
| a6 | 40 | 8 | 0 | 1 | 1d | 76 | c8 | 0 | |
| a4 | 3e | 7 | 0 | 1 | 1e | 78 | c8 | 0 | |
| a2 | 3d | 7 | 0 | 1 | 1f | 7a | c9 | 0 | |
| a1 | 3b | 6 | 0 | 1 | 20 | 7c | c9 | 0 | |
| 9f | 3a | 6 | 0 | 2 | 22 | 7e | ca | 0 | |
| 9d | 38 | 6 | 0 | 2 | 23 | 80 | ca | 0 | |
| 9c | 37 | 5 | 0 | 2 | 24 | 82 | ca | 0 | |
| 9a | 35 | 5 | 0 | 2 | 25 | 84 | cb | 0 | |
| 98 | 34 | 5 | 0 | 2 | 26 | 86 | cb | 0 | |
| 96 | 32 | 4 | 0 | 2 | 27 | 88 | cb | 0 | |
| 94 | 31 | 4 | 0 | 3 | 29 | 89 | cb | 0 | |
| 93 | 2f | 4 | 0 | 3 | 2a | 8b | cb | 0 | |
| 91 | 2e | 4 | 0 | 3 | 2b | 8d | cc | 0 | |

TABLE V

| | | | | |
|---|---|---|---|---|
| 0 | 9 | 0 | 5 | c |
| 1 | a | 1 | 8 | d |
| 1 | a | 1 | 8 | d |
| 2 | b | 2 | 9 | 0 |
| 2 | b | 2 | 9 | 0 |
| 3 | c | 3 | a | 1 |
| 3 | c | 3 | a | 1 |
| 4 | d | 4 | b | 2 |
| 1 | 8 | 1 | 8 | d |
| 2 | 9 | 2 | 9 | 0 |
| 2 | 9 | 2 | 9 | 0 |
| 3 | a | 3 | a | 1 |
| 3 | a | 3 | a | 1 |
| 4 | b | 4 | b | 2 |
| 4 | b | 4 | b | 2 |
| 5 | c | 5 | c | 3 |
| 2 | 9 | 0 | 9 | 0 |
| 3 | a | 1 | a | 1 |
| 3 | a | 1 | a | 1 |
| 4 | b | 2 | b | 2 |
| 4 | b | 2 | b | 2 |
| 5 | c | 3 | c | 3 |
| 5 | c | 3 | c | 3 |
| 8 | d | 4 | d | 4 |
| 3 | a | 1 | 8 | 1 |
| 4 | b | 2 | 9 | 2 |
| 4 | b | 2 | 9 | 2 |
| 5 | c | 3 | a | 3 |
| 5 | c | 3 | a | 3 |
| 8 | d | 4 | b | 4 |
| 8 | d | 4 | b | 4 |
| 9 | 0 | 5 | c | 5 |
| 4 | b | 2 | 9 | |
| 5 | c | 3 | a | |
| 5 | c | 3 | a | |
| 8 | d | 4 | b | |
| 8 | d | 4 | b | |
| 9 | 0 | 5 | c | |
| 9 | 0 | 5 | c | |
| a | 1 | 8 | d | |
| 5 | c | 3 | a | |
| 8 | d | 4 | b | |
| 8 | d | 4 | b | |
| 9 | 0 | 5 | c | |
| 9 | 0 | 5 | c | |
| a | 1 | 8 | d | |
| a | 1 | 8 | d | |
| b | 2 | 9 | 0 | |
| 8 | d | 4 | b | |
| 9 | 0 | 5 | c | |
| 9 | 0 | 5 | c | |
| a | 1 | 8 | d | |
| a | 1 | 8 | d | |
| b | 2 | 9 | 0 | |
| b | 2 | 9 | 0 | |
| c | 3 | a | 1 | |

The horizontal phase ROM 386 generates at its three least significant outputs Q2-0 the three most significant phase address bits in the same way as the corresponding vertical phase ROM 180. The arithmetic point lies between bits 13 and 12 and the two least significant integer bits, 14 and 13, are "counted" on a modulo 3 basis in conformity with the three point filter length in target Making specific reference now to FIG. 6B, the coefficient product bits 15-3 from coefficient product latch 374 are communicated to the D15-0 bits of a 16 bit horizontal adder 390. The 16 bit output of horizontal adder 390 is connected to a 16 word by 16 bit random access memory 392. Unlike the vertical filter 14 which was required to store three complete lines of data, one for each filter processor, the horizontal filter 16 is required to store only nine words of accumulated partial product filter data. Three words of luminance data, one for each filter processor are accumulated, three words of red-Y chrominance data, one for each filter processor are accumulated and three words of blue-Y chrominance data, one for each filter processor are accumulated. RAM 392 is thus more than adequate to meet these filter requirements. The write input of RAM 392 is driven by signal *HRAMW, horizontal RAM write, while the address inputs are driven by signal HRAMAD3-0 horizontal RAM address 3-0. The 16 bit output of RAM 392 is connected to a pixel data bus PDAT15-5 which connects to a latch 394 and also to the postscale shifter 396. It will thus be apparent that upon accumulation of a partial filter sum the amount can be stored in latch 394 for recirculation back to the B input of horizontal adder 390 and upon accumulation of a complete sum the amount can be passed to postscale shifter 396 As completed data is passed to postscale shifter 396 a signal *HENDATFB, horizontal enable data feedback, changes state to disable the output of latch 394 and enable the output of buffer 398 to cause logic 0 data to be communicated to the B input of adder 390 and added to the next coefficient partial product value.

The operation of postscale shifter 396 is essentially the same as that for the vertical filter 14. The four latches are loaded with accumulated data in response to signal HPOSTCK, horizontal post clock while the outputs thereof are selectively enabled in response to signals *HPOSTEN3-0, horizontal post enable 3-0 to provide a selectively shifted output to a data output bus DOUT7-0, which is also connected to the buffered output of vertical filter 14. Bus DOUT 7-0 couples through a horizontal output luminance FIFO component 400 and a horizontal output chrominance FIFO component 402 for separate accumulation of luminance and chrominance data. The components 400, 402 form output FIFO 17 which couples to frame store 18. The input of FIFO component 400 is clocked in response to signal PIXLCK, pixel luminance clock while the output is clocked in response to signal OUTCK, output clock. The input of horizontal chrominance FIFO component 402 is clocked in response to signal PIXCCK, pixel chrominance clock while the output is clocked in response to the output clock signal. Both FIFO memory components 400, 402 are cleared in response to the FIFO reset signal, *FRST and their outputs are enabled in response to the output enable signal, OUTEN. The four sections comprising the two FIFO output components 400, 402 have their output ready signals connected to a NAND gate 404 which generates a signal *OR, output ready when a byte of luminance data and a byte of chrominance data are simultaneously ready for outputting to an external circuit. The sign bit for chrominance data being input to HOUT Chrom FIFO 402 is complemented by an inverter 406 to return the chrominance data to a two's complement negative number representation.

Figure 7:
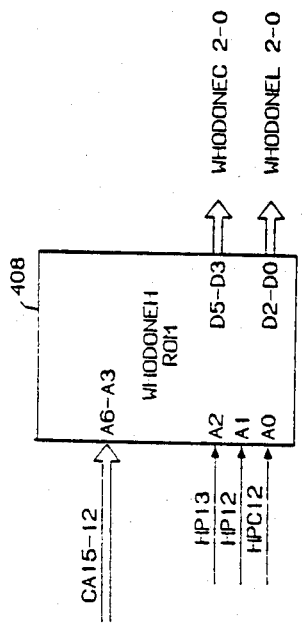
FIG. 7 is a block diagram representation of a horizontal "who-done" signal generating circuit used in the system shown in FIG. 1.

As shown in FIG. 7, a who done horizontal ROM 408 operates in a manner similar to the more significant portion of vertical phase ROM 180 to generate signals WHODONEC 2-0 and WHODONEL 2-0 at the D5-D3 and D2-D0 outputs thereof respectively. The contents of who done H ROM 408 are set forth in Table VI.

TABLE VI

| | | | | |
|---|---|---|---|---|
| 0 | c | 12 | 0 | 0 |
| 4 | c | 14 | 8 | 2 |
| 4 | c | 14 | 8 | 2 |
| 24 | 9 | 24 | c | 2 |
| 24 | 9 | 24 | c | 2 |
| 21 | 11 | 21 | c | 4 |
| 21 | 11 | 21 | c | 4 |
| 21 | 12 | 21 | 9 | 24 |
| 0 | 0 | 14 | a | 0 |
| 20 | 4 | 24 | c | 0 |
| 20 | 4 | 24 | c | 0 |
| 21 | 4 | 21 | c | 4 |
| 21 | 4 | 21 | c | 4 |
| 21 | 1 | 21 | 9 | 24 |
| 21 | 1 | 21 | 9 | 24 |
| 22 | 11 | 22 | 11 | 21 |
| 0 | 0 | 0 | c | 12 |
| 1 | 0 | 4 | c | 14 |
| 1 | 0 | 4 | c | 14 |
| 1 | 1 | 24 | 9 | 24 |
| 1 | 1 | 24 | 9 | 24 |
| 2 | 11 | 21 | 11 | 21 |
| 2 | 11 | 21 | 11 | 21 |
| a | 12 | 21 | 12 | 21 |
| 0 | 0 | 0 | 0 | 14 |
| 0 | 1 | 20 | 4 | 24 |
| 0 | 1 | 20 | 4 | 24 |
| 2 | 11 | 21 | 4 | 21 |
| 2 | 11 | 21 | 4 | 21 |
| a | 12 | 21 | 1 | 21 |
| a | 12 | 21 | 1 | 21 |
| c | 12 | 22 | 11 | 22 |
| 0 | 0 | 0 | 0 | |
| 2 | 10 | 1 | 0 | |
| 2 | 10 | 1 | 0 | |
| a | 12 | 1 | 1 | |
| a | 12 | 1 | 1 | |
| c | 12 | 2 | 11 | |
| c | 12 | 2 | 11 | |
| c | 14 | a | 12 | |
| 0 | 0 | 0 | 0 | |
| 8 | 2 | 0 | 1 | |
| 8 | 2 | 0 | 1 | |
| c | 2 | 2 | 11 | |
| c | 2 | 2 | 11 | |
| c | 4 | a | 12 | |
| c | 4 | a | 12 | |
| 9 | 24 | c | 12 | |
| a | 0 | 0 | 0 | |
| c | 0 | 2 | 10 | |
| c | 0 | 2 | 10 | |
| c | 4 | a | 12 | |
| c | 4 | a | 12 | |
| 9 | 24 | c | 12 | |
| 9 | 24 | c | 12 | |
| 11 | 21 | c | 14 | |

A real time filter system 415 for vertical filter 14 is illustrated in FIG. 8 as including parallel connected filter processor 0 418, filter processor 1 419 and filter processor 2 420. Filter processor 0 418 is essentially the same as vertical filter processor 0 shown in FIG. 3A and 3B. Corresponding components have been given the same numbers and, since the operation remains the same as previously described, it will not be described again.

Filter processor 1 419 and filter processor 2 420 are identical to filter processor 0 418 except that the filter coefficient data stored by filter coefficient ROMS 192 is successively phase shifted by one pixel position as described in conjunction with FIG. 3A. The three filter processors of FIG. 8 operate simultaneously and in parallel rather than in a time sequential mode as in the non-real time arrangement shown in FIG. 3A and 3B. The time delays associated with the sequential processing can thus be eliminated so that received pixel data can be processed at the real time data input rate. Although the timing relationships for the real time filter 415 will not be described in detail, it will be appreciated by those skilled in the art that the signals producing a sequence of 3 pulses need now only produce the first or zero pulse as shown in FIG. 4 which is communicated to all three filter processors 418-420 simultaneously. The control signals for post-scale shifter 410 and buffers 166, 168 can occur earlier in time by 4 time cells.

A real time version of horizontal filter 16 has not been explicitly shown. However, it will be appreciated that a real time version can be built by eliminating sequential time multiplexed operations and performing such operations simultaneously in parallel as in the arrangement of FIG. 8.

While there have been described above various arrangements of an electronic still store system with a target image oriented filter for the purpose of enabling a person skilled in the art to make and use the invention, it will be appreciated that the invention is not limited thereto. Accordingly, any modifications, variations or equivalent arrangements within the scope of the attached claims should be considered to be within the scope of the invention.

What is claimed is:

1. The method of filtering a sequence of input digital data values comprising the steps of:

multiplying each input digital data value by one of a plurality of filter coefficients to generate a plurality of corresponding products, each filter coefficient corresponding to the value of a desired function of time between an occurrence of an output digital data value within an output time domain and a time of occurrence of the input digital data value when mapped into the output domain, each filter coefficient corresponding to a different output data value in a sequence of output data values;

accumulating each product corresponding to each input digital data value so long as the filter coefficient is not zero; and outputting the accumulated products in sequential order to produce the sequence of output data values.

2. The method of filtering according to claim 1 above, wherein the outputting step further includes the steps of outputting the accumulated product corresponding to each output data value when the filter coefficients associated with all further input digital data values are equal to zero and the multiplying and accumulating steps include multiplying each input digital data value by a filter coefficient corresponding to a next output data value in sequence and accumulating the products corresponding thereto each time an accumulated product value is output.

3. The method of filtering according to claim 1 or 2 above, further comprising the step of scaling each input digital data value and the accumulated products output data values corresponding in magnitude to corresponding input digital data values.

4. The method of filtering according to claim 3 above, wherein the scaling step further comprises the step of prescaling each input digital data value by a prescale factor between 0.5 and 1.0 and postscaling the output data values by a postscale factor which is in integral power of 2.5.

5. The method of mapping a frequency limited one dimensional source array of source data values into a frequency limited one dimensional target array of target data values comprising the steps of:

establishing a filter response function defining a filter coefficient as a function of displacement from a target point within a target array and a location of the source data value transformed into the target array;

mapping each source data value in the source array into the target array; and for each point in the target array generating an associated target data value as the sum of all products of each source data value in the source array and a filter coefficient defined therefore as a function of the displacement of each mapped source data value from the point in the array.

6. The method of mapping according to claim 5 above, wherein during the establishing step the filter coefficient is established at zero for displacements greater than a selected maximum magnitude and during the generating step source data values for points having a displacement with respect to a given point in the target array are ignored when generating the associated target data value.

7. The method of filtering a sequence of input data values representing an array of source image data points to generate a sequence of output data values representing an array of target image data points comprising the steps of:

selecting a desired filter impulse function for distribution about each target image data point;

mapping each input data value to the target image in accordance with a selected size ratio;

determining for each mapped data value and for each target image data point which is influenced by the mapped data value, a filter coefficient value in accordance with the selected impulse function and the position of the mapped data value relative to the target image data point;

multiplying each input data value by each filter coefficient value determined therefore to produce a corresponding coefficient product for each multiplication; and for each target image data point, summing all of the coefficient products associated with the selected impulse function for the target image data point to produce an output target image data point value.

8. The method of filtering a sequence of input data values representing an array of source image data points to generate a sequence of output data values representing an array of target image data points defining a target image having a selectable size ratio to the source image comprising the steps of:

receiving an input data value in sequence;

incrementing a phase parameter by the reciprocal of a selected size ratio each time an input data value corresponding to a next source image data point is received;

using the phase parameter to access a given number of filter coefficient functions corresponding to a number of filter points spanned by the filter coefficient functions in target image space to obtain a given number of filter coefficient values corresponding thereto;

multiplying each filter coefficient value by the input data value to produce a coefficient product pertaining to a corresponding target image data point;

maintaining a partial sum parameter for each target image data point which is influenced by the input data value;

adding each coefficient product to the partial sum parameter to produce a new partial sum parameter for the target image data corresponding thereto until a last input data value influencing the target image point has been received and then outputting the partial sum parameter as a target image data point value, resetting the partial sum parameter, and reassigning the partial sum parameter to a next target data point in sequence; and repeating the above steps until there are no more input data values.

9. The method of filtering as set forth in claim 8 above, wherein the filter extends in a first direction and wherein the above steps are repeated using the target image data point values output by the above steps as input data values for the repeated steps with the filter direction for the repeated steps being perpendicular to the first direction.

10. The method of generating a target sequence of mapped and filtered target data values as a function of a source sequence of source data values comprising the steps of:

for each source data value in sequence:

mapping the source data value into the target sequence by generating a mapped address representative of the position of the source data value within the target sequence; and for each target data value within a given maximum displacement from the mapped address:

(1) determining a filter coefficient as a function of the displacement and a preselected filter impulse function;

(2) multiplying the source data value by the filter coefficient to obtain a product; and (3) summing the product with any previous products for the target data value until the products corresponding to all of the source data values having a displacement less than the given maximum displacement have all been summed to generate a total sum target data value.

11. The method of generating a target sequence of mapped and filtered target data values according to claim 10 above, further comprising the step of producing a sequence of scaled target data values by multiplying each total sum target data value by a scaling factor determined according to an amount of compaction of the target sequence compared to the source sequence.

12. The method of generating a target array of mapped and filtered target video data values defining a target image as a function of a source sequence of source video data values defining a source image comprising the steps of:

for each source video data value in sequence:

mapping the source video data value into the target image by generating a mapped address representative of the position of the source data value within the target image; and for each target video data value within a given maximum displacement from the mapped address:

(1) determining a filter coefficient as a function of the displacement and a preselected filter impulse function;

(2) multiplying the source data value by the filter coefficient to obtain a product; and (3) summing the product with any previous products for the target video data value.

13. The method of mapping a source image represented by at least one line of data points into a target image that is filtered in accordance with a selected filter function comprising the steps of:

generating a target image address for each data point in the at least one line of data points in the source image; and calculating a target data value for each point in the target image as a sum of products of all source image data point values having a generated target image address displaced not more than a given maximum magnitude from a target image address of the point in the target image, each said product being the product of a source image data value multiplied by a filter coefficient determined from said selected filter function in accordance with the displacement of the generated target image address for the source data value from the target image address of the point in the target image.

14. The method of mapping a source television video image having a first size and being represented by at least one line of data points into a target television video image having a second size different from the first size and being represented by at least one data point, the target television video image being filtered in accordance with a selection filter function, the method comprising the steps of:

generating a target television video image address for each data point in the at least one line of data points in the source television video image; and calculating a target data value for each point in the target television video image as a sum of products of all source television video image data point values having a generated target television video image address displaced not more than a given maximum magnitude from a target television video image address of the point in the target television video image, each such product being the product of a source image data value multiplied by a filter coefficient determined from said selected filter function in accordance with the displacement of the generated target image address for the source data value from the target image address of the point in the target television video image.

15. The method of mapping according to claim 14 above, further comprising the step of providing source data values for the source television video image in linear sequence one point at a time and wherein the generating step further comprises generating the target television image address for each source data point sequentially and concurrently with the providing of the source data value therefor and wherein the calculating step further comprises calculating simultaneously and in parallel a number of different sequential target data values at least equal to a number of target television image points having a displacement not greater than the given maximum magnitude from any selected target television video image point such that as all contributing products for a given target television video image data point have been summed, the resulting target data value can be output and calculating of a target data value for a next sequential target television video image data point can be substituted therefor without skipping the calculating of a target data value for any target television video image data point.

16. The method of transforming a first linear array of source data points, each having an associated source data value, into a second, filtered linear array of target data points, each having a target data value associated therewith comprising the steps of:

providing in sequence the source data values associated with each source data point in the first linear array;

generating a target array address corresponding to each source data point as the source data value associated therewith is provided;

calculating simultaneously and in parallel a target data value for each of a plurality of sequential target data points by summing for each source data value provided a product of the source data value provided and a filter coefficient dependent upon a filter function selected for the transformation and a displacement of the generated target array address corresponding to the source data point from each target data point for which the calculating is being performed; and sequentially advancing the target data values associated with the calculating step by outputting a target data value when all products associated therewith have been summed and beginning the calculating of a target data value for a next sequential target data point in place of the most recently output target data value until a target data value has been calculated for each target data point in the second, filtered linear array.

17. The method of transforming a first array of source data points, each having an associated source data value, into a second, filtered array of target data points, each having a target data value associated therewith, comprising the steps of:

providing in sequence the source data values associated with each source data point in the first array;

generating a target array address corresponding to each source data point as the source data value associated therewith is provided;

calculating in parallel a target data value for each of a plurality of target data points by summing for each source data value provided a product of the source data value provided and a filter coefficient dependent upon a filter function selected for the transformation and a position of the generated target array address corresponding to the source data point within the second array relative to the position of the target data point within the second array until all products which contribute to the target data value have been summed.

18. An image compression filtering system comprising:

a source frame store storing a source video image and sequentially outputting source data values representing the source video image in response to a sequence of source video image point addresses;

a source address counter coupled to provide to the source frame store the sequence of source video image point addresses corresponding to the output source data values;

a given number, N, of processing stages, each being assigned in sequence to a different target video image data point, each processing stage including a coefficient store coupled to output a filter coefficient for a preselected filter function in response to a coefficient address that is indicative of a displacement within the target image between the target video image data point to which the processing stage is assigned and a location of an output source data value mapped into the target video image, a multiplier coupled to receive each output source data value and a corresponding filter coefficient and provide as an output the product thereof, an accumulator coupled to receive from the multiplier and sum, N sequential products to generate a target data value representative of the target video image point to which the processing stage is assigned, each processing stage being coupled to output the accumulated sum and begin summing products for a next sequential target data point when N products have been summed;

a coefficient address generator coupled to generate for each source data value the coefficient address corresponding thereto;

a target frame store coupled to receive and store each target data value output by one of the accumulators; and a target address counter responsive to the coefficient address generator and coupled to provide to the target frame store a target frame store address defining a location for storing each successive target data value.

19. An image transformation filtering system receiving a sequence of source image data point values and comprising:

means for generating a given plurality of filter coefficients for each received source image data point value, each filter coefficient being associated with a different target image data point and being determined in accordance with a selected filter function and a displacement between the point at which the received source image data point value maps into the target image and the associated target image data point;

means for multiplying each generated filter coefficient by a received source image data point value to generate a given plurality of products for each received source image data point value, each having the same association with a target image data point as the filter coefficient from which the product was generated;

means for separately summing the products associated with each different target image data point to produce a target image data point value corresponding thereto when the products resulting from all source image data point values which affect the target image data point value in accordance with the selected filter function have all been summed.

20. The image transformation filtering system according to claim 19 above, further comprising means responsive to the summing of all products associated with a given target image data point for outputting the target image data point value corresponding thereto and replacing the association between the filter coefficient generating means and the given target image data point with an association with a next sequential unassociated target image data point such that the target image data point values are determined in sequence for each target image data point.

21. The image transformation filtering system according to claim 20 above, wherein each target image data point value consists of the given plurality of products and the target image data points associated with the filter coefficients are sequentially staggered such that every time a next source image data point value affects a next unassigned target image data point value a previously assigned target image data point value has been completed and the filter coefficient associated therewith can be reassociated with the next source image data point value.

22. A target image references filter having a fixed number of sample points in target image space comprising:
   a coefficient multiplier coupled to receive each of a sequence of source image input data values and multiply each input data value by a corresponding filter coefficient value for each target image data point that is influenced by the input data value to produce a corresponding coefficient product;
   a coefficient store address circuit coupled to output a pixel phase address to a coefficient store and to increment the pixel phase address in proportion to the reciprocal of a selected size ratio between a target image and a source image each time an input data value relating to a next source image data point is received;
   the filter coefficient store coupled to receive the pixel phase address as an address input thereto and in response to output the filter coefficient values in accordance with a selected filter impulse function and a displacement between each target image data point influenced by the data input value and the input data value when mapped into target space as determined by the pixel phase address;
   a store coupled to receive and store sums of coefficient products relating to each of a plurality of target image data points;
   an adder coupled to add each coefficient product to a corresponding sum of coefficient products stored in the store to produce a new sum and to communicate the new sum back to the store for storage therein in place of said sum of coefficients; and
   an output control circuit coupled to output a partial sum as a target map data point value and reset a corresponding stored partial sum value in response to the pixel phase address when the pixel phase address indicates that all coefficient products relating to a given target image data point have been received.

23. The target image references filter according to claim 22 above, further comprising a scale multiplier coupled to multiply a value contributing to the target image data point values by a scale factor selected to provide a given filter gain.

24. The target image referenced filter according to claim 23 above, wherein the given filter gain is one.

25. A video still store system comprising:
   an image store storing a plurality of frames of video images;
   a filter system coupled to receive from the image store, and filter, a frame of input data defining a source image to generate a corresponding frame of output data defining a target image, the target image having a selected size ratio to the source image, the filter system including serially connected vertical and horizontal filters, each being target image oriented filters having a predetermined number of filter points with respect to the frame of output data and a number of filter points with respect to the frame of input data which varies with the selected size ratio; and
   a frame store coupled to receive and store the frame of output data and to generate an output video signal repetitively defining a video image represented by the frame of output data stored in the frame store.

26. The video still store system according to claim 25 above, wherein the vertical and horizontal filters each include a plurality of filter processors equal in number to the number of target image filter points with each processor being assigned to a different target image sample data point and wherein each filter processor independently processes each element of the frame of input data.

27. The video still store system according to claim 26 above, wherein the filter processors are assigned in order to sequential target image sample data points with each filter processor being assigned on a rotating basis to a next sequential unassigned target image sample data point as soon as processing for a current target image sample data point is completed.

28. The video still store system according to claim 27 above, wherein the predetermined number of filter points is 3.

29. The video still store system according to claim 27 above, wherein the plurality of filter processors operate simultaneously and in parallel to process the frame of input data on a real time basis at a video data rate.

30. The video still store system according to claim 27 above, wherein the plurality of filter processors operate on a nonsimultaneous basis and sequentially share at least one filter processor circuit element.

31. The video still store system according to claim 27 above, wherein each filter processor includes a coefficient product store storing an accumulated sum of coefficient products and a coefficient store storing filter coefficient values defining a selected filter coefficient curve and wherein each filter processor include a means operable to multiply each input data value by a coefficient value received from the coefficient store to produce a coefficient product and to add the coefficient product to the sum of coefficient products stored by the coefficient product store until coefficient products for all source image data points which contribute to a target image data point have been summed.

32. A video still store system providing selected size compression of a video image comprising:
   an image store storing at least one frame of video data defining a source image;
   a filter system including serially coupled horizontal and vertical interpolation filters coupled to receive from the image store, and filter, a frame of video data defining an input source image received from the image store to produce a frame of output video data defining a target image having a selected size ratio relative to the input source image, the vertical filter having a first predetermined number of vertical filter points with respect to the target image and including for each said target image vertical filter point a vertical filter processor including a vertical filter partial product store storing a partial product sum for each video component of each target image sample data point in a target image video line and a vertical coefficient store having address inputs and storing at address locations corresponding to distances between a point in the target image and a current filter point in the target image a filter coefficient value selected to produce a desired horizontal filter response function, each vertical filter processor including means operable in response to each received source image data point value to obtain from the vertical coefficient store the filter coefficient value, to multiply the obtained coefficient value by the received source image data point value to produce a coefficient product and to increment the stored partial product sum corresponding to a current target image data point by the coefficient product until the point values for all of the source image data points which contribute to a target image filter point have been processed with a completed partial product sum being output when the data point values for all of the source image points which contribute to a target image point have been processed, the horizontal filter having a second predetermined number of horizontal filter points with respect to the target image and including for each said target image horizontal filter point a horizontal filter processor including a horizontal filter partial product store storing a partial product sum for each video component, and a horizontal coefficient store having address inputs and storing at address locations corresponding to distances between a point in the target image and a current filter point in the target image a filter coefficient value selected to produce a desired vertical filter response function, each vertical filter processor being operable in response to each received source image data point value to obtain from the horizontal coefficient store the filter coefficient value, to multiply the obtained coefficient value by the received source image data point value to produce a coefficient product and to increment the stored partial product sum corresponding to a current target image data point by the coefficient product until the data point values for all of the source image data points which contribute to a target image filter point have been processed with a completed partial product sum being output when the data point values for all of the source image points which contribute to the target image point have been processed; and a frame store coupled to receive from the filter system, and store, a frame of output video data defining a target image.

33. The video still store system according to claim 32 above, wherein the vertical filter includes a single vertical phase counter coupled to provide a single vertical phase count to the address inputs of the vertical coefficient store of each vertical filter processor, wherein the vertical coefficient store of each vertical filter processor has the filter coefficient values stored with a phase relationship to the address locations thereof selected to align each stored coefficient value with the vertical phase count, wherein the horizontal filter includes a single horizontal phase counter coupled to provide a single horizontal phase count to the address inputs of the horizontal coefficient store of each horizontal filter processor, and wherein the horizontal coefficient store of each horizontal filter processor has the filter coefficient values stored with a phase relationship to the address locations thereof selected to align each stored coefficient value with the horizontal phase count.

34. The video still store system according to claim 33 above, wherein the vertical phase counter is coupled to be incremented by the reciprocal of the selected size ratio each time a new source image data point value is received by the vertical filter and wherein the horizontal phase counter is coupled to be incremented by the reciprocal of the selected size ratio each time a new source image data point value is received by the horizontal filter.

35. The video still store system according to claim 34 above, wherein the vertical phase counter is coupled to count integer values of the vertical phase count on a modulo N basis where N is the predetermined number of vertical filter points, and wherein the horizontal phase counter is coupled to count integer values of the horizontal phase count on a modulo M basis where M is the predetermined number of horizontal filter points.

* * * * *

UNITED STATES PATENT AND TRADEMARK OFFICE
CERTIFICATE OF CORRECTION

PATENT NO. : 4,602,285

DATED : July 22, 1986

INVENTOR(S) : Daniel A. Beaulier and Theodore A. Marsh

It is certified that error appears in the above-identified patent and that said Letters Patent is hereby corrected as shown below:

Claim 4, line 6, "2.5" should read --2--;

Claim 5, line 5, "definlng" should read --defining--;

Column 14, line 14, "greatere" should read --greater--;

Column 14, line 16, "vlaues" should read --values--;

Column 17, line 66, line of text is missing on patent: after
    line 65 and before line 66 there should be an additional
    line of figures reading --22   21   10   15--.

Signed and Sealed this

Sixteenth Day of February, 1988

Attest:

DONALD J. QUIGG

Attesting Officer     Commissioner of Patents and Trademarks